US011570929B2

(12) United States Patent
Inda et al.

(10) Patent No.: US 11,570,929 B2
(45) Date of Patent: Jan. 31, 2023

(54) EJECTABLE FAN WITH PUSH-PUSH ATTACHMENT MECHANISM AND CORRESPONDING METHODS

(71) Applicant: ARRIS Enterprises LLC, Suwanee, GA (US)

(72) Inventors: Carlos Gonzalez Inda, Apodaca (MX); Julio Cesar Ayala Vera, Apodaca (MX); Sergio Antonio Delon Canseco, Apodaca (MX); Oswaldo Enrique Linares Rivas, Apodaca (MX); Luis Lopez Moreno, Apodaca (MX)

(73) Assignee: ARRIS Enterprises LLC, Suwanee, GA (US)

( * ) Notice: Subject to any disclaimer, the term of this patent is extended or adjusted under 35 U.S.C. 154(b) by 134 days.

(21) Appl. No.: 17/104,509

(22) Filed: Nov. 25, 2020

(65) Prior Publication Data

US 2021/0161027 A1    May 27, 2021

Related U.S. Application Data

(60) Provisional application No. 62/940,717, filed on Nov. 26, 2019.

(51) Int. Cl.
*H05K 7/20* (2006.01)
*F04D 29/64* (2006.01)
*F04D 29/60* (2006.01)

(52) U.S. Cl.
CPC ....... *H05K 7/20172* (2013.01); *F04D 29/601* (2013.01); *F04D 29/646* (2013.01)

(58) Field of Classification Search
CPC .. H05K 7/20172; F04D 29/601; F04D 29/646
(Continued)

(56) References Cited

U.S. PATENT DOCUMENTS 4,792,165 A    12/1988  Nishimura
6,027,350 A *   2/2000  Chen .................... H01R 13/633
                                                       439/159

(Continued)

FOREIGN PATENT DOCUMENTS

EP      1392095 A1    2/2004
TW    201115032 A     5/2011

OTHER PUBLICATIONS

International Search Report and Written Opinion Re: Application No. PCT/US2020/062253 (dated Mar. 1, 2021).

*Primary Examiner* — Logan M Kraft
*Assistant Examiner* — John D Bailey
(74) *Attorney, Agent, or Firm* — Chernoff, Vilhauer, McClung & Stenzel, LLP

(57) ABSTRACT

A fan receiver assembly (1200) includes a fan receiver (101). The fan receiver includes a rear wall (128) and at least one sidewall (112). At least one deformable clasp (105) is coupled to, and translatable along, the sidewall. The deformable clasp includes at least one latching arm (142) that is pivotable between an axially displaced open position occurring when the latching arm extends beyond a terminal end sidewall and a parallel position occurring when the latching arm is situated between the terminal end and the rear wall. The sidewall defines a d-track (111) having a terminal end (125) and an outward notch (126). A follower situates within the d-track between the deformable clasp and the sidewall. A fan module (102) latches to the fan receiver assembly when the follower situates within the outward notch.

17 Claims, 15 Drawing Sheets

(58) Field of Classification Search
USPC .................................................... 415/213.1
See application file for complete search history.

(56) References Cited

U.S. PATENT DOCUMENTS

| | | | | |
|---|---|---|---|---|
| 6,077,037 A * | 6/2000 | Schmidt | ............... | F04D 29/601 415/214.1 |
| 6,109,940 A * | 8/2000 | Chad | ............... | H01R 13/4538 439/141 |
| 6,839,233 B2 * | 1/2005 | Cravens | ............... | G06F 1/20 361/825 |
| 6,976,879 B2 * | 12/2005 | Shishikura | ............ | H01R 27/00 439/630 |
| 7,011,537 B1 * | 3/2006 | Wu | .................. | G06K 13/0806 439/159 |
| 7,081,020 B1 * | 7/2006 | Lee | ............... | G06K 13/08 439/946 |
| 7,112,075 B1 * | 9/2006 | Su | .................. | G06K 13/0843 439/159 |
| 7,314,390 B1 * | 1/2008 | Lai | ............... | G06K 13/0831 439/159 |
| 7,349,211 B2 * | 3/2008 | Chen | ............... | H05K 7/20172 415/213.1 |
| 7,374,397 B2 * | 5/2008 | Lee | ............... | F04D 29/601 415/214.1 |
| 7,414,839 B2 * | 8/2008 | Yu | ............... | H01L 23/4093 165/122 |
| 7,503,806 B2 * | 3/2009 | Lin | ............... | G06K 13/0831 439/630 |
| 7,708,575 B2 * | 5/2010 | Motojima | ............ | G06K 7/0021 439/159 |
| 8,197,191 B2 * | 6/2012 | Binks | ............... | B64D 29/08 415/214.1 |
| 8,197,272 B2 * | 6/2012 | Matsunaga | .......... | H01R 13/635 439/923 |
| 8,303,321 B1 * | 11/2012 | Little | ............... | G06K 13/0825 439/159 |
| 8,303,322 B1 * | 11/2012 | Little | ............... | G06K 13/0825 439/159 |
| 8,379,387 B2 * | 2/2013 | Chuang | ............. | H05K 7/20172 415/213.1 |
| 8,814,582 B2 * | 8/2014 | Lee | ............... | G06K 13/0812 439/159 |
| 9,213,921 B2 * | 12/2015 | Lei | ............... | G06K 7/0013 |
| 9,590,356 B2 * | 3/2017 | Joo | ............... | H01R 13/6335 |
| 9,839,153 B2 * | 12/2017 | Mühsam | ............. | H05K 7/1489 |
| 2004/0115986 A1 | 6/2004 | Chen et al. | | |
| 2005/0159035 A1 * | 7/2005 | Shih | ............... | H01R 12/87 439/159 |
| 2007/0105446 A1 * | 5/2007 | Lai | ............... | H01R 27/00 439/630 |
| 2008/0014093 A1 * | 1/2008 | Fan | ............... | F04D 29/601 416/244 R |
| 2010/0260602 A1 * | 10/2010 | Binks | ............... | B64D 33/02 415/214.1 |
| 2011/0158801 A1 * | 6/2011 | Wang | ............... | F04D 29/601 415/214.1 |
| 2014/0206215 A1 * | 7/2014 | Wang | ............... | G06K 13/0818 439/160 |
| 2015/0351280 A1 * | 12/2015 | Gonzalez Inda | ....... | G06F 1/181 415/126 |
| 2016/0053776 A1 * | 2/2016 | Williams | ............. | G11B 33/142 415/126 |
| 2016/0222983 A1 | 8/2016 | Shih et al. | | |
| 2016/0258446 A1 * | 9/2016 | Tio | ............... | F04D 29/582 |
| 2016/0327062 A1 * | 11/2016 | Amin-Shahidi | ... | H05K 7/20736 |
| 2017/0042060 A1 * | 2/2017 | Chen | ............... | F04D 25/0613 |
| 2018/0235102 A1 * | 8/2018 | Anderl | ............... | F04D 25/0613 |
| 2021/0131450 A1 * | 5/2021 | Yang | ............... | F04D 19/002 |

* cited by examiner

EJECTABLE FAN WITH PUSH-PUSH ATTACHMENT MECHANISM AND CORRESPONDING METHODS

CROSS REFERENCE TO RELATED APPLICATIONS

This application claims benefit of U.S. Provisional Patent Application No. 62/940,717, entitled "EJECTABLE FAN WITH PUSH-PUSH ATTACHMENT MECHANISM AND CORRESPONDING METHODS," filed Nov. 26, 2019, which application is hereby incorporated by reference herein.

BACKGROUND

Technical Field

This disclosure relates generally to fans, and more particularly to fan assemblies.

Background Art

In server systems and other advanced computing platforms, large numbers of electronic components are often populated on printed circuit boards disposed within a chassis. When these components are all working simultaneously, they generate high amounts of heat. This heat must be removed from the chassis to prevent the circuit components from overheating. Fans are traditionally used in chassis-based systems to remove heat so that electrical components within the chassis can function properly.

While fans are effective at removing heat, they frequently suffer from wear due to continual or intermittent operation. Due to this mechanical wear, many manufacturers recommend that fans be replaced after a predetermined amount of use to prevent the fans from malfunctioning. Failed fans can cause the components within the chassis to overheat due to the lack of enough fresh air being brought into the chassis from the outside. This can cause the components within the chassis to lose efficiency. Moreover, the components in the chassis could eventually stop functioning properly due to excessive temperatures that occur as a result of inadequate heat dissipation.

Replacement of fans can occur either in the field or in a repair center. The decision determining where the electrical components must be taken "off-line" or out of service. Moreover, if replacement operations are difficult specialized technicians are required, which increases replacement cost. It would be advantageous to have an improved fan assembly that allowed simple replacement of fans in the field without taking corresponding electrical equipment off-line.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present disclosure.

Figure 1:
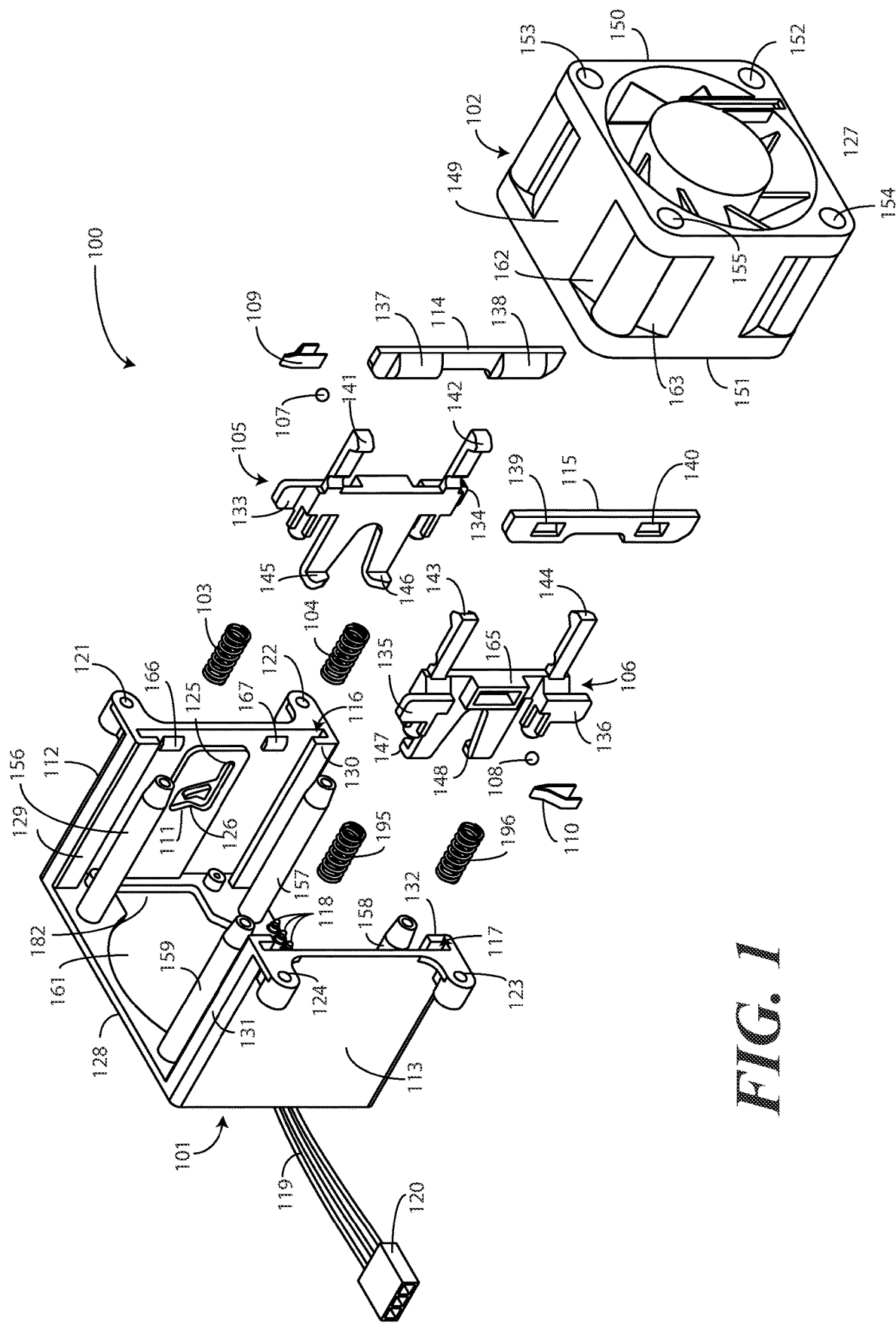
FIG. 1 illustrates an exploded view of one explanatory fan assembly in accordance with one or more embodiments of the disclosure.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present disclosure.

DETAILED DESCRIPTION OF THE DRAWINGS

Embodiments of the disclosure are now described in detail. Referring to the drawings, like numbers indicate like parts throughout the views. It is expected that one of ordinary skill, notwithstanding possibly significant effort and many design choices motivated by, for example, available time, current technology, and economic considerations, when guided by the concepts and principles disclosed herein will be readily capable of generating the fan assemblies and fan receivers described below with minimal experimentation.

As used in the description herein and throughout the claims, the following terms take the meanings explicitly associated herein, unless the context clearly dictates otherwise: the meaning of "a," "an," and "the" includes plural reference, the meaning of "in" includes "in" and "on." Relational terms such as first and second, top and bottom, and the like may be used solely to distinguish one entity or action from another entity or action without necessarily requiring or implying any actual such relationship or order between such entities or actions.

The terms "substantially", "essentially", "approximately", "about" or any other version thereof, are defined as being close to as understood by one of ordinary skill in the art, and in one non-limiting embodiment the term is defined to be within 10 percent, in another embodiment within 5 percent, in another embodiment within 1 percent and in another embodiment within 0.5 percent. The term "coupled" as used herein is defined as connected, although not necessarily directly and not necessarily mechanically. Also, reference designators shown herein in parenthesis indicate components shown in a figure other than the one in discussion. For example, talking about a device (10) while discussing figure A would refer to an element, 10, shown in figure other than figure A.

As noted above, in advanced computing systems, large amounts of heat must be reliably removed from the housing or chassis of a computational device to keep the temperature-sensitive electronic circuits inside operating properly. The traditional method for removing heat is to place one or more fans along the vertical sidewalls of the chassis. These fans are bolted along the sidewalls to hold them in place. Electronic busses situated within the chassis then power the fans.

While in this traditional configuration of bolting fans to the sidewalls, or alternatively bolting the fans to the bottom wall, fans can be functionally effective in removing heat, it is not without certain problems. Many of these computers systems are continually powered. Consequently, the fans attached to the chassis must run constantly. It is known, however, that fans periodically degrade and fail, and therefore must be replaced. In conventional systems, this requires powering down the electronic components in the chassis (and quite frequently the entire computational system those components support), removing the chassis from the system, at least partially disassembling the chassis with specialized tools to remove the fan. A technician must then replace the fan and re-assembling the chassis with the specialized tools. Only then can the electronic components and system be brought back on-line. These steps are labor intensive and time consuming to say the least, each of which results in additional cost for the system manufacturer.

Embodiments of the present disclosure provide a solution to the issues provides above. Embodiments of the disclosure provide for a new fan module and fan receiver that allows the fan module to be coupled to, and ejected from, the fan receiver with a "push-push" latching mechanism. This latching mechanism provides a technician with the option of easily replacing the fan module without the necessity of disassembling a chassis or other product to which the fan receiver is coupled. Said differently, the technician can replace the fan module using simply their fingers, and without the need for any tools or special skills. Fan receivers configured in accordance with embodiments of the disclosure can be coupled to different chassis or other forced air-cooling system products, thereby allowing for the quick and simple exchange of fan modules.

In one or more embodiments, a fan receiver assembly comprises a fan receiver. In one or more embodiments, the fan receiver comprises a rear wall and at least one sidewall.

In one or more embodiments, at least one deformable clasp is coupled to, and translatable along, the at least one sidewall. In one or more embodiments, the at least one deformable clasp comprises at least one latching arm that is pivotable relative to the at least one deformable clasp between an axially displaced open position occurring when the at least one latching arm extends beyond a terminal end of the at least one sidewall and a parallel position occurring when the at least one latching arm is situated between the terminal end and the rear wall.

In one or more embodiments, the fan receiver assembly further comprises one or more coiled springs biasing the at least one deformable clasp away from the rear wall. In one or more embodiments, the at least one latching arm comprises a living hinge. In one or more embodiments, the at least one latching arm is pivotable between the axially displaced open position and the parallel position about the living hinge.

In one or more embodiments, the at least one sidewall defines a d-track comprising a terminal end and an outward notch. A follower is situated within the d-track between the at least one deformable clasp and the at least one sidewall. In one or more embodiments, the at least one deformable clasp defines a blind slot. In one or more embodiments, a flat spring is situated in the blind slot and biases the follower into the d-track recess. In one or more embodiments, the d-track defines a terminal end and an outward notch defining stoppage stations for the follower when the at least one latching arm pivotable is in the an axially displaced open position and the parallel position, respectively.

Embodiments of the disclosure provide numerous benefits over prior art fan systems. First and foremost, embodiments of the disclosure reduce the amount of time required to replace a fan module. This results in a reduction of costs associated with maintaining fan operability in forced air-cooling systems.

Second, embodiments of the disclosure require no tools or special knowledge to replace a fan module. To attach a fan module to the fan receiver, one simply pushes the fan module into the fan receiver to compress one or more coiled springs and to cause one or more deformable clasps to latch into place, thereby retaining the fan module within the fan receiver. To detach the fan module from the fan receiver, one simply makes the same push motion. This causes the one or more springs to eject the fan module from the fan receiver with minimal effort.

Third, in one or more embodiments one or more spring-biased electrical connectors are integrally coupled to the fan receiver. These spring-biased electrical connectors couple to complementary electrical connectors, configured as conductive pads in one or more embodiments, at the fan module. Thus, in one or more embodiments these spring-biased electrical connectors make the electrical connections between the fan receiver and the fan module.

When replacing the fan module, the spring-biased electrical connectors stay in place. Accordingly, a user simply inserts the new fan module into the fan receiver sufficiently for the deformable clasps to latch, which results in the complementary electrical connectors engaging the spring-biased electrical connectors. Consequently, fan modules can be removed by hand and can be installed and uninstalled without rerouting or manipulating any electrical connectors or wiring. Advantageously, a technician need not manipulate any wiring harnesses or electrical connections when replacing the fan module.

Fourth, embodiments of the disclosure allow for fan modules to be "hot swappable." This means that the fan module can be replaced while the corresponding equipment to which the fan receiver is attached remains operational. The fan receiver allows for easy replacement of a fan module during service, without the necessity of either turning OFF the device to which the fan module is connected, and without opening the device.

Fifth, with embodiments of the disclosure, only a technician's fingers are required to swap a fan module. The technician requires no tools. To the contrary, fan modules can be removed simply by using a hand. Additionally, no trained technicians are required and the replacement operation can be completed within a very short time.

Advantageously, embodiments of the disclosure allow users to maintain only a single part number for the fan module, which can be inserted quickly and easily in a fan receiver mounted at any position along a chassis or electronic device. This is in contrast to prior art systems that require a technician to pull several different parts under several different part numbers simply to replace a fan. Embodiments of the disclosure offer improved ergonomics and ease of handling as well.

In one or more embodiments, the fan module and fan receiver assembly employs the use of a simple, and intuitive set of deformable clasps that operate in conjunction with a follower situated in a d-track to define a push-push latching system. In one or more embodiments, this push-push latching system is configured into a fan receiver that is operable with a pair of deformable clasps, one or more coiled springs, one or more flat springs, one or more followers, and one or more deformable clasp deformer/retainers. In one or more embodiments, the fan receiver also includes one or more spring-biased electrical connectors that make electrical contact with one or more complementary connectors exposed upon the fan module.

Turning now to FIG. 1, illustrated therein is an exploded view of one explanatory system 100 configured in accordance with one or more embodiments of the disclosure. The system 100 includes a fan receiver 101 and a fan module 102. The fan receiver 101 is manufactured into an assembly that includes the fan receiver 101, one or more coiled springs 103,104,195,196, and one or more deformable clasps 105, 106. One or more followers 107,108 are biased by one or more flat springs 109,110 into one or more d-tracks 111 recessed into the sidewalls 112,113 of the fan receiver 101. One or more deformable clasp deformer/retainers 114,115 are used to retain the deformable clasps 105,106 within respective translation slots 116,117 during operation.

In one or more embodiments, one or more spring-biased electrical connectors 118 are mechanically coupled to the fan receiver 101, and are electrically coupled to one or more wires 119 attached to a cable harness. As will be shown in more detail below with reference to FIGS. 13-17, in one or more embodiments the fan module 102 includes one or more complementary electrical connectors that are exposed and contact the one or more spring-biased electrical connectors 118 to form an electrical connection therebetween when the fan module 102 is latched into the fan receiver 101. The combination of the spring-biased electrical connectors 118 and the complementary electrical connectors provides the benefit of an electrical "quick connect" feature to facilitate an electrical connection between the motor of the fan module 102 and the power supply to which the wire harness 120 is connected.

In one or more embodiments, the fan receiver 101 comprises one or more fastener bosses 121,122,123,124 that facilitate attachment of the fan receiver 101 to a chassis or another electronic product. Examples of objects to which the fan receiver 101 can be attached include a metal chassis wall of a wall-mounted chassis, a desktop mounted chassis, or a rack mounted chassis. Other types of electronic devices to which the fan receiver 101 can be attached will be obvious to those of ordinary skill in the art having the benefit of this disclosure.

In one or more embodiments, fasteners such a screws can be passed through the apertures of the one or more fastener bosses 121,122,123,124, and then through apertures in the chassis or electronic product. Nuts can be coupled to the screws to securely retain the fan receiver 101 in an attached configuration to the chassis or electronic product.

As will be explained in more detail below with reference to FIGS. 13-17, in one or more embodiments the d-tracks 111 (sidewall 113 includes a d-track that is a mirror image of d-track 111) serve as a guiding groove for the followers 107,108 to facilitate the push-push latching/ejection operation of the system 100. Additionally, a terminal end 125 and an outward notch 126 of the d-tracks 111 serve as stoppage stations for the latched (followers 107,108 situated in outward notches 126) and unlatched (followers 107,108 situated at the terminal ends 125) conditions of the fan receiver 101. The remainder of the d-tracks 111 provides one or more follower guides within which the followers 107,108 translate during translation of the fan module 102 into, and out of, the fan receiver 101.

In one or more embodiments, the rear side of each deformable clasp 105,106 includes a blind slot 165 that receives a corresponding follower 108 and flat spring 110. In one or more embodiments, the flat spring 110 biases the follower 108 into its corresponding d-track. As the deformable clasp 105 translates it its translation slot 117, the follower 108 translates in its d-track between a latched position and an unlatched position.

In one or more embodiments, each of the fan receiver 101, the deformable clasps 105,106, and the deformable clasp deformer/retainers 114,115 can be manufactured from a thermoplastic material by way of an injection molding process. For example, in one embodiment one or more of the fan receiver 101, the deformable clasps 105,106, and the deformable clasp deformer/retainers 114,115 are manufactured from a polycarbonate plastic resin via an injection molding process. Other thermoplastic materials may also be used, such as acrylonitrile butadiene styrene (ABS), polycarbonate, and polycarbonate-ABS due to their durability. Other equivalents, such as styrene for example, may be substituted. Other materials for manufacturing the fan receiver 101, the deformable clasps 105,106, and the deformable clasp deformer/retainers 114,115 will be obvious to those of ordinary skill in the art having the benefit of this disclosure.

In one or more embodiments, a rear wall 128 of the fan receiver 101 separates the sidewalls 112,113. In the illustrative embodiment of FIG. 1, a first sidewall 112 extends distally from a first end the rear wall 128 at an angle that is substantially orthogonal to the rear wall 128. Similarly, a second sidewall 113 extends distally from a second, opposite end of the rear wall 128 at another angle that is substantially orthogonal with the rear wall 128.

In one or more embodiments, each of the first sidewall 112 and the second sidewall 113 includes a pair of L-shaped rails. In this example, the first sidewall 112 includes a first pair of oppositely facing L-shaped rails 131,132, while the second sidewall 113 includes a second pair of oppositely facing L-shaped rails 129,130. Each pair of oppositely facing L-shaped rails 129,130,131,132 defines a translation slot 116,117. Wings 133,134,135,136 of each deformable clasp 105,106 situate within, and are configured to translate along, the translation slots 116,117.

As will be described in more detail below, the deformable clasp deformer/retainers 114,115, which are put into place in the fan receiver 101 after the wings 133,134,135,136 of each deformable clasp 105,106 are inserted into the translation slots 116,117 then prevent the deformable clasps 105,106 from escaping from the translation slots 116,117. Said differently, the deformable clasp deformer/retainers 114,115 retain the wings 133,134,135,136 within the translation slots 116,117 in one or more embodiments.

In one or more embodiments, the deformable clasp deformer/retainers 114,115 are retained within the fan receiver 101 by one or more snap fit protrusions 166,167. In one or more embodiments, the rear side of the arm deformers 137,138 of each deformable clasp deformer/retainer 114,115 defines a recess 139,140 that situates atop corresponding snap fit protrusions 166,167 to retain the deformable clasp deformer/retainers 114,115 within the fan receiver 101 and to secure the deformable clasps 105,106 within the translation slots 116,117.

The deformable clasp deformer/retainers 114,115 also perform another function. As shown in FIG. 1, in one or more embodiments the deformable clasp deformer/retainers 114,115 each include arm deformers 137,138. As will be described in more detail below, in one or more embodiments each arm deformer 137,138 functions to cause a corresponding latching arm 141,142,143,144 of each deformable clasp 105,106 from an axially displaced open position, when the latching arms 141,142,143,144 are extending beyond the terminal ends of the sidewalls 112,113 to a parallel position when the latching arms 141,142,143,144 are situated between the sidewalls 112,113. Said differently, in one or more embodiments the latching arms 141,142,143,144 are pivotable relative to the deformable clasps 105,106 between an axially displaced open position occurring when the one latching arms 141,142,143,144 extend beyond a terminal end of the first sidewall 112 or the second sidewall 113 and a parallel position occurring when the latching arms 141,142,143,144 are situated between the terminal ends of the first sidewall 112 or the second sidewall 113 and the rear wall 128.

In one or more embodiments, each latching arm 141,142,143,144 includes a living hinge located at the body of the deformable clasp. The living hinge facilitates an articulated motion or deformation of each latching arm 141,142,143,144 between the axially displaced open position and the parallel position to release, or engage, the fan module, respectively. In one or more embodiments each latching arm 141,142,143,144 includes a latch at an end opposite the living hinge. In one or more embodiments, the latch clasps about an edge 150 of the housing 149 of the fan module 102 to secure the fan module 102 within the fan receiver 101 when the fan module 102 is latched to the fan receiver 101.

In one or more embodiments, the latching arms 141,142, 143,144 extend beyond the terminal ends of the sidewalls 112,113 when the followers 107,108 situate within the terminal ends 125 of the d-tracks 111. By contrast, the latching arms 141,142,143,144 are situated between the sidewalls 112,113 once the followers 107,108 translate from the terminal ends 125 of the d-tracks 111 to the base of the "d."

In one or more embodiments, the fan module 102 includes a housing 149. In this illustrative embodiment, the housing 149 terminates at one or more edges, e.g., edges 150 and 151. In one embodiment, these edges 150,151 define substantially orthogonal corners of the housing 149. In one or more embodiments, the housing 149 of the fan module 102 also includes one or more apertures 152,153,154,155 that pass through the housing 149.

In the illustrative embodiment of FIG. 1, the fan receiver 101 includes one or more bosses 156,157,158,159 extending distally from the rear wall 128. In this embodiment the one or more bosses 156,157,158,159 extend from a base at the rear wall 128 to a distal end. In this embodiment the distal end of each boss 156,157,158,159 includes an inward taper. When the fan module 102 is latched to the fan receiver 101, the bosses 156,157,158,159 insert into the apertures 152,153,154,155 of the fan module 102. The push-push latching mechanism then retains the one or more bosses 156,157,158,159 within the one or more apertures 152,153, 154,155 when the fan module 102 is latched to the fan receiver 101.

In the illustrative embodiment of FIG. 1, four bosses 156,157,158,159 are provided to insert into and engage the apertures 152,153,154,155 of the fan module 102. In other embodiments, two or three bosses can be used instead of four. Where a fan assembly has more mating features disposed along its engagement face, more bosses can be used. While the bosses 156,157,158,159 of FIG. 1 are circular in cross section, those of ordinary skill in the art having the benefit of this disclosure will appreciate that other cross-sectional shapes could be substituted for the circular cross sections as well, especially when the apertures 152,153,154,155 have shapes other than the cylindrical ones shown.

The inclusion of the bosses 156,157,158,159 advantageously provides a quick an easy alignment tool with which to align the fan module 102 with the fan receiver 101. Second, the use of bosses 156,157,158,159 prevents lateral translation of the fan module 102 when it is latched to the fan receiver 101. Moments and other lateral forces can be created when the fan 127 of the fan module 102 is running at high speed. Including the bosses 156,157,158,159 provides a stabilizing mechanism that prevents the moments or other lateral forces from dislodging the fan module 102 from the fan receiver 101.

In one embodiment, one or more recesses, e.g., recesses 162,163, can be disposed about the housing 149. The recesses 162,163 not only save material in the housing 149, but make the fan assembly easier to hold as well.

In one or more embodiments, the deformable clasps 105,106 include L-shaped feet 145,146,147,148 extending distally from the deformable clasp 105,106 in a direction opposite that of the latching arms 141,142,143,144. In one or more embodiments, when the fan module 102 begins to insert into the fan receiver 101, the L-shaped feet 145,146, 147,148 catch the edge 151 of the housing 149 of the fan module 102. The further insertion of the fan module 102 into the fan receiver 101 causes the deformable clasps 105,106 to translate within the translation slots 116,117. It additionally causes the follower 107,108 to translate within the d-tracks 111 in one or more embodiments. It further causes the four coiled springs 103,104,195,196 to compress. Accordingly, the L-shaped feet 145,146,147 are configured to serve as contact surfaces to activate the push-push latching system from either the latched or unlatched states in one or more embodiments.

In one or more embodiments, the rear wall 128 defines an aperture 160 through which the fan 127 of the fan module 102 can draw, or blow, air. In one embodiment, the aperture 160 includes a first portion 161 having an area and size that is substantially similar to that of the central cavity of the fan module 102. In this illustrative embodiment, the aperture 160 also defines two additional portions 182 (a mirror image of additional portion 182 is on the opposite of first portion 161, as shown in FIG. 2) through which the L-shaped feet 145,146,147,148 may pass when the push-push latching mechanism is actuated.

In one or more embodiments, the fan module 102 comprises a motor (not shown) that is situated within the fan module 102. The fan 127 turns in response to the motor and draws air through a central cavity of the fan module 102.

When removing the fan module 102 from the fan receiver 101, the push-push latching system is released by pressing the fan module 102 toward the rear wall 128 of the fan receiver 101 sufficiently to cause the L-shaped feet 145,146, 147,148 to pass into the additional portions 182 of the aperture 160. This allows the fan module 102 to be removed and replaced. In one or more embodiments when this occurs, the coiled springs 103,104,195,196 push the fan module 102 away from the rear wall 128 of the fan receiver 101.

Figure 2:
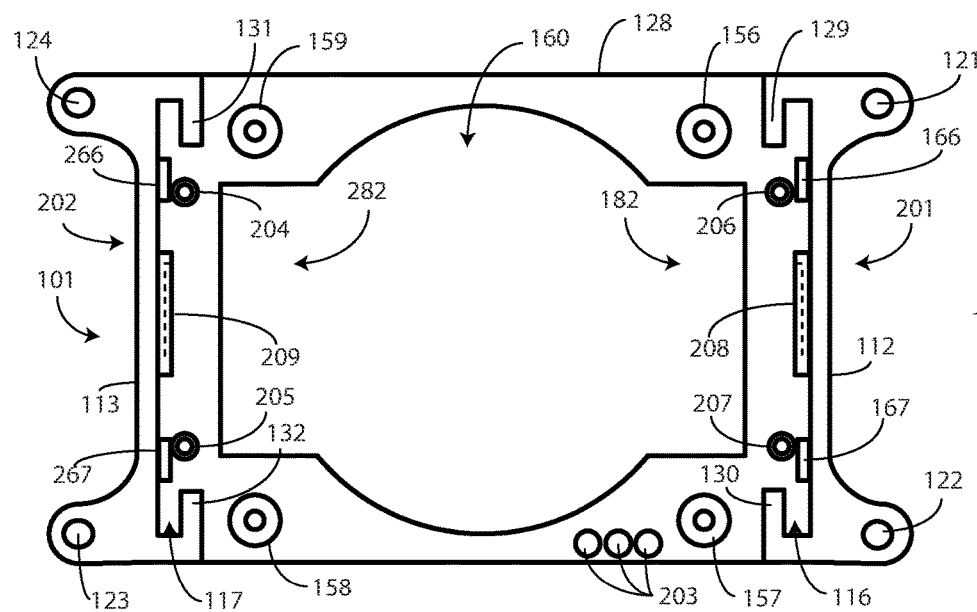
FIGS. 2 and 3 illustrate a front elevation view and a perspective view, respectively, of one explanatory fan receiver in a first state of assembly in accordance with one or more embodiments of the disclosure.
Figure 3:
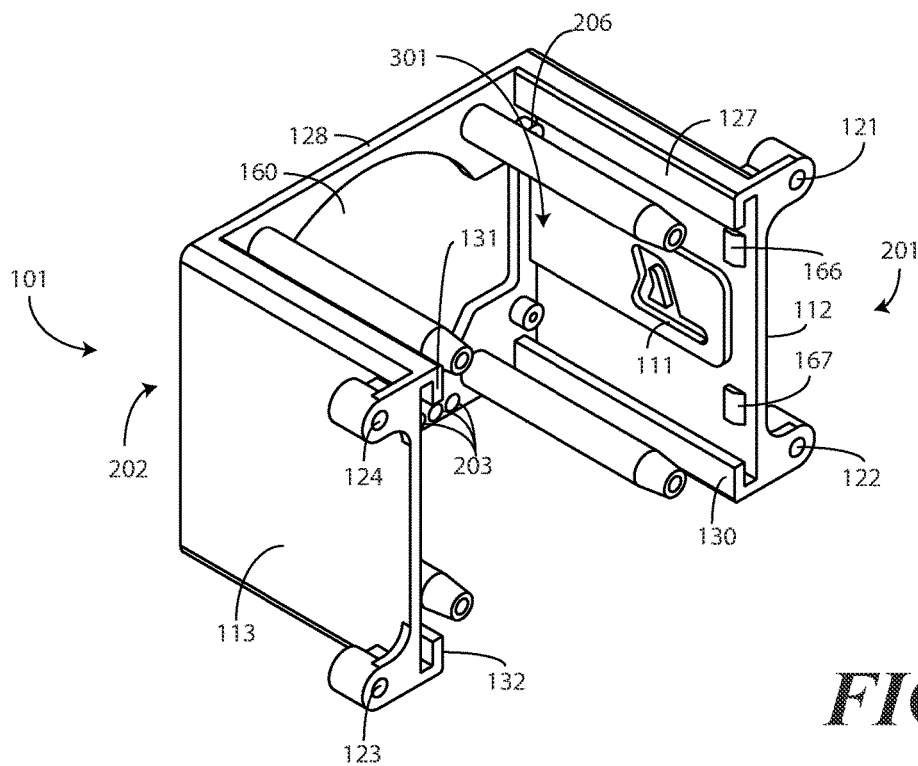

Turning now to FIGS. 2 and 3, illustrated therein is a front elevation view and a perspective view, respectively, of the fan receiver 101 of FIG. 1. As shown, the fan receiver 101 includes two sidewalls 112,113 and a rear wall 128. The rear wall 128 interspaces the two sidewalls 112,113 of this embodiment, with a first sidewall 112 extending orthogonally from a first side 201 of the rear wall 128, and a second sidewall 113 extending orthogonally from a second side 202 of the rear wall.

In this illustrative embodiment, each of the rear wall 128 and the sidewalls 112,113 include many different physical features that enable the fan receiver 101 to be manufactured into an assembly for use with the fan module (102) in the system (100) of FIG. 1. In one or more embodiments, the rear wall includes one or more apertures 203 that accommodate one or more spring-biased electrical connectors 118. The one or more spring-biased electrical connectors 118 can be passed from the rear side of the rear wall 128 through the one or more apertures 203 such that the front ends of the one or more spring-biased electrical connectors 118 protrude into the cavity 301 defined by the rear wall 128 and the two sidewalls 112,113. An adhesive, press fit connector, or other connector can be used to retain the one or more spring-biased electrical connectors 118 within the one or more apertures 203.

In one or more embodiments, the rear wall 128 of the fan receiver 101 includes one or more studs 204,205,206,207 that project into the cavity 301 defined by the rear wall 128 and the sidewalls 112,113. In one or more embodiments the one or more studs 204,205,206,207 serve as positioning posts for the one or more coiled springs (103,104,195,196). In one or more embodiments, the outer diameter of the one or more studs 204,205,206,207 is less than the inner diameter of the one or more coiled springs (103,104,195,196) such that one or more coiled springs (103,104,195,196) can be placed atop the one or more studs 204,205,206,207 with portions of the one or more coiled springs (103,104,195, 196) encircling the one or more studs 204,205,206,207. In this illustrative embodiment, there are four studs 204,205, 206,207, with each stud corresponding to a coiled spring on a one-to-one basis. Thus, a first coiled spring (103) could be placed atop a first stud 206, while a second coiled spring (104) is placed atop a second stud 207, and so forth.

In one or more embodiments, each of the first sidewall 112 and the second sidewall 113 includes a raised platform 208,209 that extends from the interior side of each sidewall 112,113 into the cavity 301 defined by the sidewalls 112,113 and rear wall 128. In one or more embodiments, d-tracks 111 are recessed into the raised platforms 208,209. For example, in this illustrative embodiment d-track 111 is recessed into platform 208 while a mirror image d-track is recessed into raised platform 209. In other embodiments, the d-tracks 111 can be recessed directly into the sidewalls 112,113 of the fan receiver 101.

As shown in FIG. 2, the fan receiver 101 comprises one or more fastener bosses 121,122,123,124 that facilitate attachment of the fan receiver 101 to a chassis or another electronic product. Fasteners such a screws can be passed through the apertures of the one or more fastener bosses 121,122,123,124, and then through apertures in the chassis or electronic product. Nuts can be coupled to the screws to securely retain the fan receiver 101 in an attached configuration to the chassis or electronic product.

In one or more embodiments, each of the first sidewall 112 and the second sidewall 113 includes a pair of L-shaped rails. In this example, the first sidewall 112 includes a first pair of oppositely facing L-shaped rails 131,132, while the second sidewall 113 includes a second pair of oppositely facing L-shaped rails 129,130. Each pair of oppositely facing L-shaped rails 129,130,131,132 defines a translation slot 116,117 for wings (133,134,135,136) a deformable clasp (105,106), as will be illustrated in more detail below.

In one or more embodiments each sidewall includes one or more snap fit protrusions 166,167,266,267 that extend distally from interior surfaces of the sidewalls 112,113 into the cavity 301 defined by the rear wall 128 and sidewalls 112,113. In this illustrative embodiment, the one or more snap fit protrusions 166,167,266,267 are configured as ramped protuberances. As will be described in more detail below, in one or more embodiments deformable clasp deformer/retainers (114,115) pass over, and are retained within the fan receiver 101 by, these snap fit protrusions 166,167,266,267. While four snap fit protrusions 166,167, 266,267 are shown in FIGS. 2 and 3, more or fewer than four snap fit protrusions 166,167,266,267 can be used as well in other embodiments.

In one or more embodiments, the fan receiver 101 includes one or more bosses 156,157,158,159 extending distally from the rear wall 128. In this embodiment the one or more bosses 156,157,158,159 extend from a base at the rear wall 128 to a distal end, which is out of the page as shown in FIG. 2. In one or more embodiments the distal end of each boss 156,157,158,159 includes an inward taper. In this illustrative embodiment, four bosses 156,157,158,159 are provided. However, more or fewer bosses could be used in other embodiments. While these bosses 156,157,158,159 are circular in cross section, those of ordinary skill in the art having the benefit of this disclosure will appreciate that other cross-sectional shapes could be substituted for the circular cross sections as well.

In one or more embodiments, the rear wall 128 defines an aperture 160. In this illustrative embodiment, the aperture 160 comprises a curvilinear aperture having a first portion 161 that is substantially circular and two additional portions 182,282 that are substantially rectangular.

Figure 4:
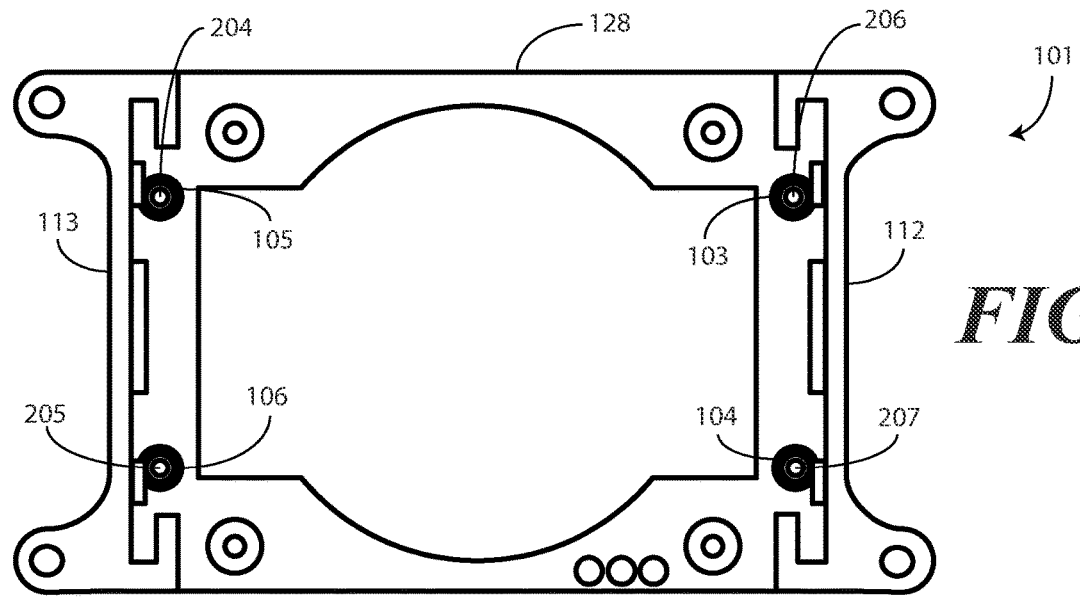
FIGS. 4 and 5 illustrate a front elevation view and a perspective view, respectively, of one explanatory fan receiver in a second state of assembly in accordance with one or more embodiments of the disclosure.
Figure 5:
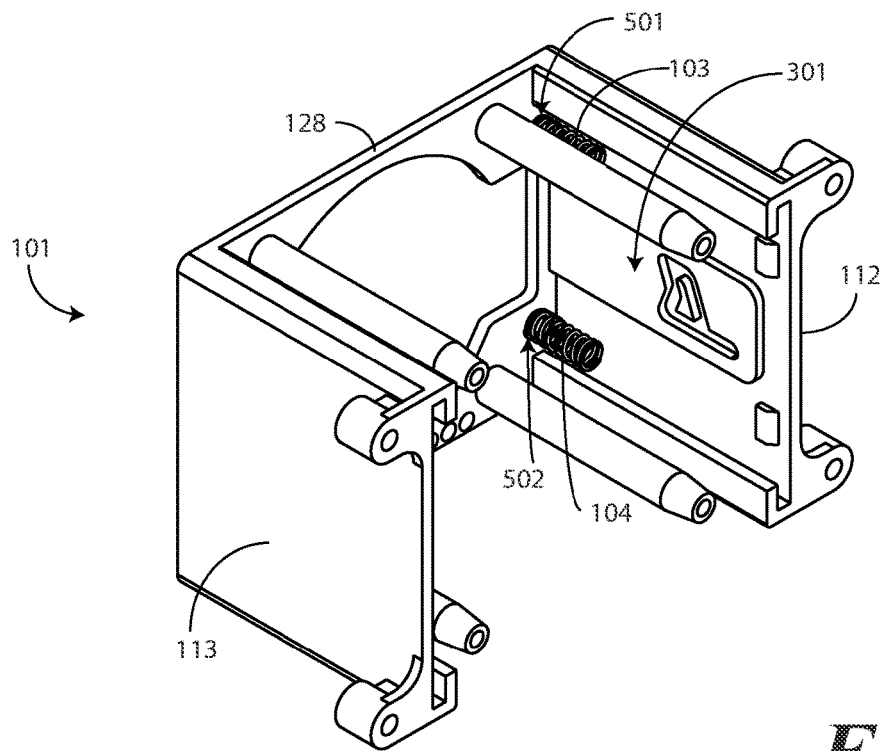

Now that the features and components of the system have been described, attention will be turned to an explanatory method of assembling a fan receiver assembly in accordance with one or more embodiments of the disclosure. Turning now to FIGS. 4 and 5, illustrated therein is a front elevation view and a perspective view, respectively, of the fan receiver 101 of FIG. 1.

In FIGS. 4 and 5, the one or more coiled springs 103, 104,195,196 have been placed atop the one or more studs 204,205,206,207 that project into the cavity 301 defined by the rear wall 128 and the sidewalls 112,113. This allows the one or more studs 204,205,206,207 to serve as positioning and retention posts for the one or more coiled springs 103,104,195,196.

In one or more embodiments, the outer diameter of the one or more studs 204,205,206,207 is less than the inner diameter of the one or more coiled springs 103,104,195,196 such that one or more coiled springs 103,104,195,196 situate around, and are optionally frictionally retained to the sides of, the one or more studs 204,205,206,207. In one or more embodiments, portions 501,502 of the one or more coiled springs 103,104,195,196 encircle the outer surfaces of one or more studs 204,205,206,207.

Figure 6:
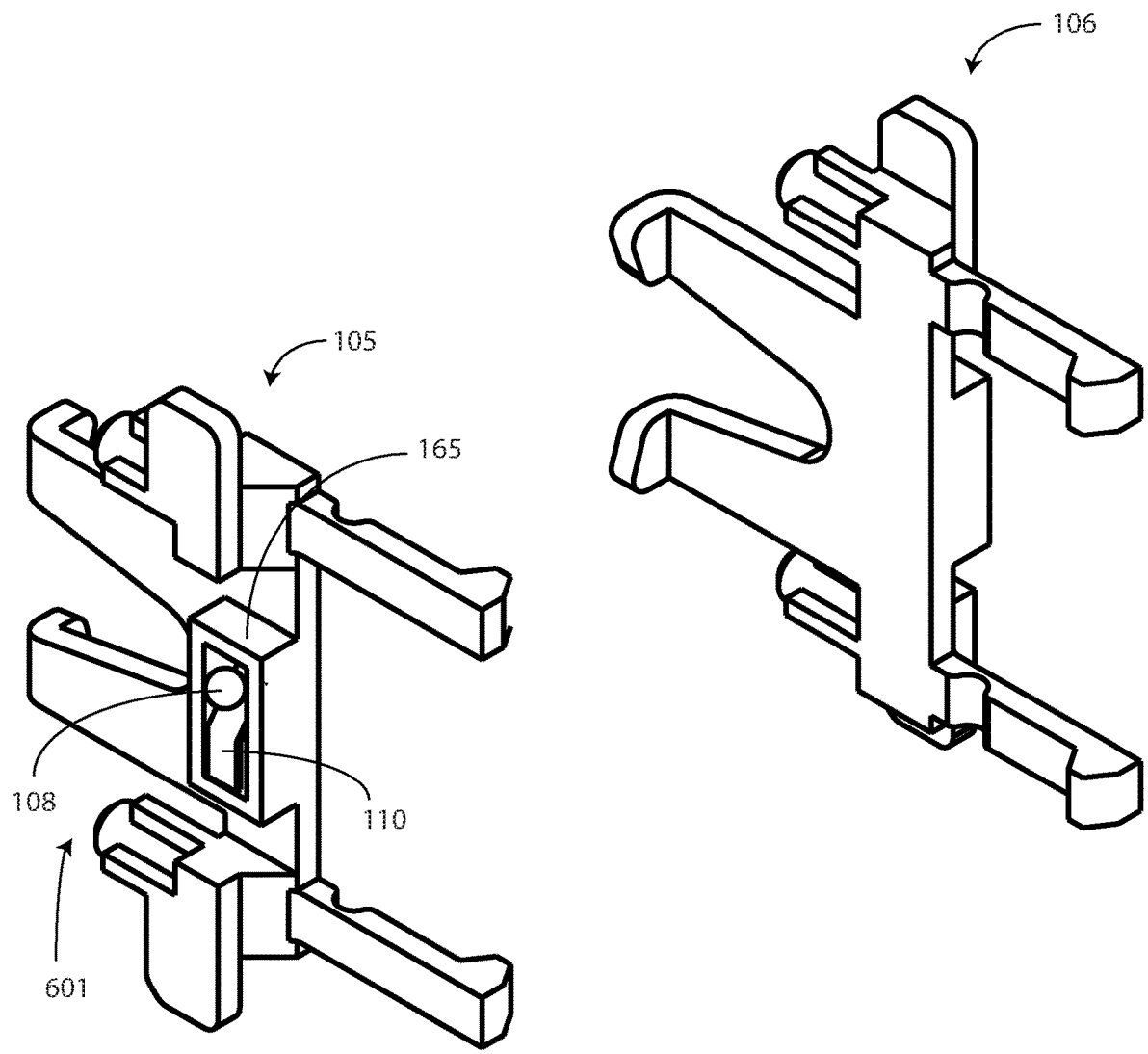
FIG. 6 illustrates a perspective view of a pair of explanatory deformable clasps in accordance with one or more embodiments of the disclosure.

Turning now to FIG. 6, illustrated therein is an enlarged view of the one or more deformable clasps 105,106. As shown in FIG. 6, in one or more embodiments the rear side 601 of each deformable clasp 105,106 includes a blind slot 165. In one or more embodiments, the blind slot 165 receives a follower 108 and flat spring 110. In FIG. 6, the follower 108 and flat spring 110 have both been positioned in the blind slot 165, with the flat spring 110 situated between the follower 108 and the inner surface of the blind slot. Deformable clasp 106 has been similarly configured with flat spring 109 and follower 107 being placed into the blind slot disposed along its rear side.

In one or more embodiments, the flat spring 110 biases the follower 108 outwardly from the blind slot 165. Pressing the follower 108 into the blind slot 165 causes the flat spring 110 to compress and accumulate a loading force. This loading force works to push the follower 108 away from the base of the blind slot 165. In one or more embodiments, this loading force can cause the follower to translate in a d-track 111 to facilitate a push-push latching and unlatching operation.

Figure 7:
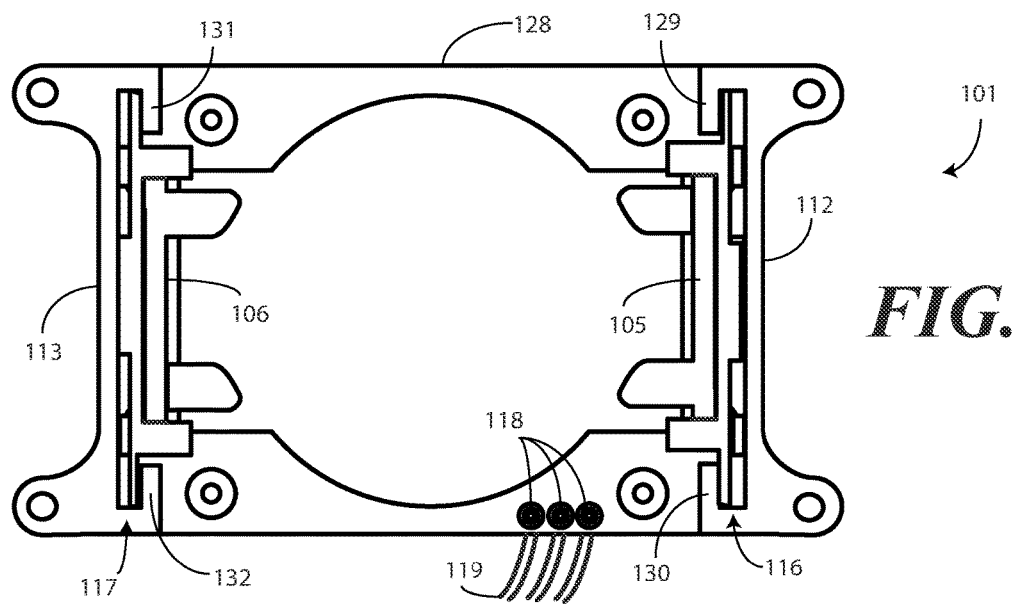
FIGS. 7 and 8 illustrate a front elevation view and a perspective view, respectively, of one explanatory fan receiver in a third state of assembly in accordance with one or more embodiments of the disclosure.
Figure 8:
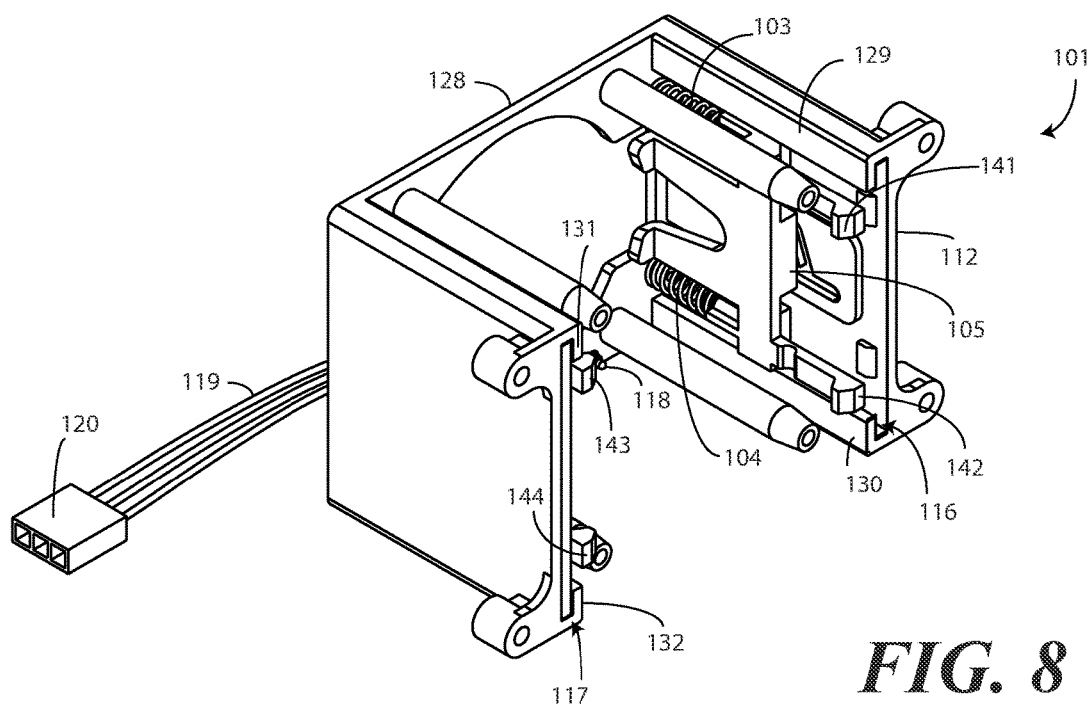

Turning now to FIGS. 7 and 8, illustrated therein is a front elevation view and a perspective view, respectively, of the fan receiver 101 of FIG. 3, which has the one or more coiled springs 103,104,(156,166) attached thereto. In FIGS. 7-8, the one or more spring-biased electrical connectors 118 are mechanically coupled to the fan receiver 101 through the apertures (203) in the rear wall 128. As shown, these spring-biased electrical connectors 118 are electrically coupled to one or more wires 119. The one or more wires 119 are then attached to a wire harness 120.

The deformable clasps 105,106 have been coupled to the fan receiver 101 in FIGS. 7-8. As described above, in one or more embodiments each of the first sidewall 112 and the second sidewall 113 includes a pair of L-shaped rails, with the first sidewall 112 including a first pair of oppositely facing L-shaped rails 131,132, while the second sidewall 113 includes a second pair of oppositely facing L-shaped rails 129,130. Each pair of oppositely facing L-shaped rails 129,130,131,132 defines a translation slot 116,117.

To couple the deformable clasps 105,106 to the fan receiver 101, wings (133,134,135,136) of each deformable clasp 105,106 are aligned with these translation slots 116, 117. The wings (133,134,135,136) are then pushed into the translation slots 116,117 such that they situate within, and are can translate along, the translation slots 116,117. When the wings (133,134,135,136) translate toward the rear wall 128 the body of each deformable clasp 105,106 engages a distal end of a coiled spring 103,104,(165,166), compressing the same toward the rear wall 128 and the studs (204,205, 206,207) to which the coiled springs 103,104,(165,166) are attached.

In one or more embodiments, this results in the sidewalls of the blind slots (165) of the deformable clasps 105,106 abutting the raised platforms (208,209) extending from the interior side of each sidewall 112,113. Since the flat springs (109,110) bias the followers (107,108) outwardly from the blind slots (165) of the deformable clasps 105,106, and since the raised platforms (208,209) each include a d-track (111) recessed therein, in one or more embodiments the flat springs (109,110) bias the followers (107,108) into a corresponding d-track, which serves as a guiding groove for the followers (107,108). As the deformable clasps 105,106 translate it their translation slots 116,117, the followers (107,108) correspondingly translate in the d-tracks. As will be explained in more detail below, this translation can occur between a latched position and an unlatched position to provide a push-push engagement mechanism.

Figure 9:
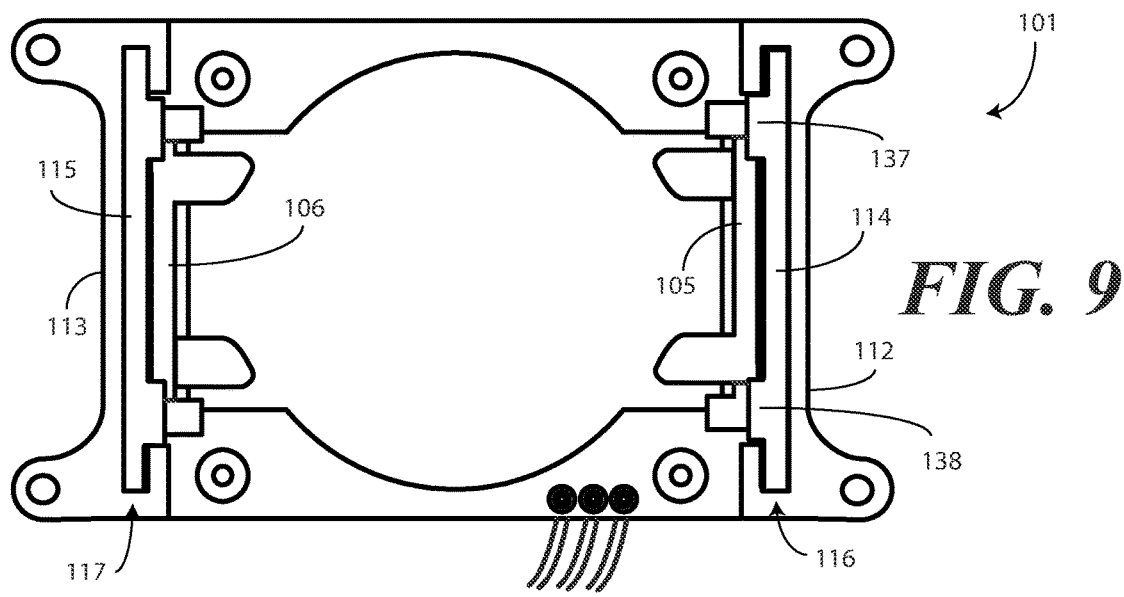
FIGS. 9 and 10 illustrate a front elevation view and a perspective view, respectively, of one explanatory fan receiver in a fourth state of assembly in accordance with one or more embodiments of the disclosure.
Figure 10:
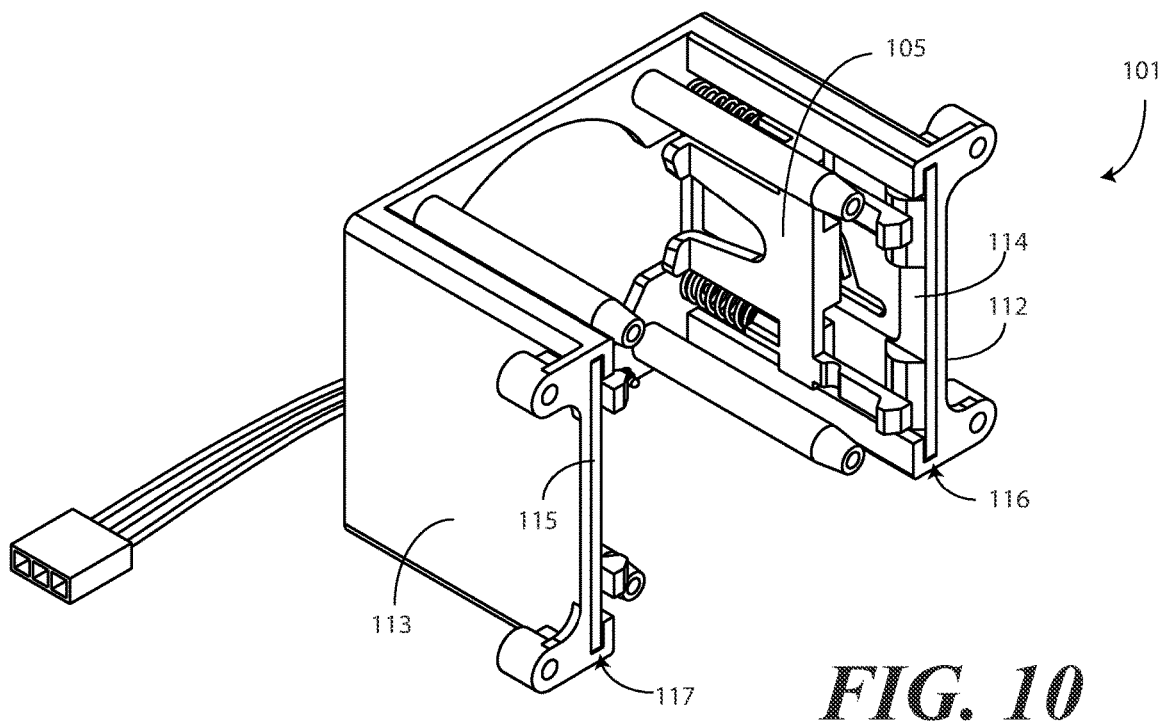

Turning now to FIGS. 9 and 10, the deformable clasp deformer/retainers 114,115 have been coupled to the fan receiver 101 after the wings (133,134,135,136) of each deformable clasp 105,106 were inserted into the translation slots 116,117 in FIGS. 7-8. The deformable clasp deformer/ retainers 114,115 prevent the deformable clasps 105,106 from escaping from the translation slots 116,117 by retaining the wings (133,134,135,136) within the translation slots 116,117 in one or more embodiments. The fan receiver assembly is now complete.

In one or more embodiments, the deformable clasp deformer/retainers 114,115 are retained within the fan receiver 101 by the one or more snap fit protrusions (166, 167) described above with reference to FIGS. 2-3. A recess (139,140) defined in the rear side of the arm deformers 137,138 of each deformable clasp deformer/retainer 114,115 situates atop corresponding snap fit protrusions (166,167) to retain the deformable clasp deformer/retainers 114,115 within the fan receiver 101 and to secure the deformable clasps 105,106 within the translation slots 116,117.

As will be shown in more detail below, in one or more embodiments the deformable clasp deformer/retainers 114, 115 each include arm deformers 137,138 that cause a corresponding latching arm 141,142,143,144 of each deformable clasp 105,106 to deform from an axially displaced open position, when the latching arms 141,142,143, 144 are extending beyond the terminal ends of the sidewalls 112,113 to a parallel position when the latching arms 141, 142,143,144 are situated between the sidewalls 112,113. In FIGS. 9-10, the latching arms 141,142,143,144 are in the parallel position.

Figure 11:
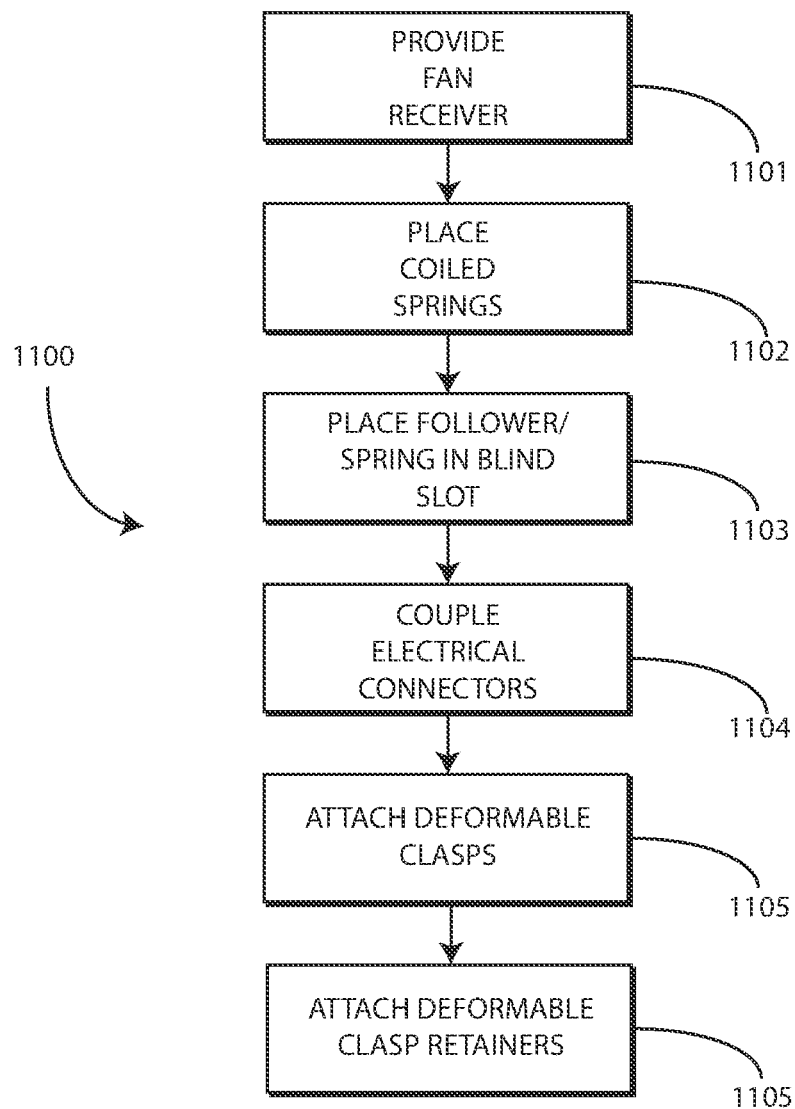
FIG. 11 illustrates one explanatory method of assembling a fan receiver in accordance with one or more embodiments of the disclosure.

Turning now to FIG. 11, illustrated therein is a method 1100 summarizing the steps illustrated and described above with reference to FIGS. 3-10. In one or more embodiments, this method 1100 is used to assemble the fan receiver assembly shown above in FIGS. 9-10.

Beginning at step 1101, a fan receiver is provided. In one or more embodiments, the fan receiver includes two sidewalls and a rear wall interspacing the two sidewalls. In one or more embodiments, a first sidewall extends orthogonally from a first side of the rear wall, and a second sidewall extends orthogonally from a second side of the rear wall.

In one or more embodiments, the rear wall includes one or more apertures that accommodate one or more spring-biased electrical connectors. In one or more embodiments, the rear wall of the fan receiver includes one or more studs that project into the cavity defined by the rear wall and the sidewalls.

In one or more embodiments, each of the first sidewall and the second sidewall includes a raised platform that extends from the interior side of each sidewall into the cavity defined by the sidewalls and rear wall. In one or more embodiments, d-tracks are recessed into the raised platforms.

In one or more embodiments, the fan receiver includes one or more fastener bosses that facilitate attachment of the fan receiver to a chassis or another electronic product. In one or more embodiments, each of the first sidewall and the second sidewall includes a pair of L-shaped rails. The oppositely facing L-shaped rails can define a translation slot for wings of a deformable clasp.

In one or more embodiments each sidewall includes one or more snap fit protrusions that extend distally from interior surfaces of the sidewalls into the cavity defined by the rear wall and sidewalls. In this illustrative embodiment, the one or more snap fit protrusions are configured as ramped protuberances.

In one or more embodiments, the fan receiver includes one or more bosses extending distally from the rear wall from a base at the rear wall to a distal end, which is optionally tapered inward. In one or more embodiments, the rear wall defines an aperture, which can include a first portion that is substantially circular and two additional portions 182,282 that are substantially rectangular.

At step 1102, one or more coiled springs are placed atop the one or more studs that project into the cavity defined by the rear wall and the sidewalls. In one or more embodiments, the outer diameter of the one or more studs is less than the inner diameter of the one or more coiled springs such that one or more coiled springs situate around the one or more studs.

At step 1103, a first follower and first flat spring are placed into a blind slot of a first deformable clasp. At step 1103, a second follower and second flat spring are placed into a blind slot of a second deformable clasp. In one or more embodiments, the follower and flat spring of each deformable clasp are positioned in the blind slot with the flat spring situated between the follower and the inner surface of the blind slot.

At step 1104, one or more spring-biased electrical connectors are mechanically coupled to the fan receiver. In one or more embodiments, the one or more spring-biased electrical connectors are mechanically coupled to the fan receiver through the apertures in the rear wall.

At step 1105, the deformable clasps are coupled to the fan receiver. In one or more embodiments, this includes aligning wings of each deformable clasp with a translation slot of the fan receiver. In one or more embodiments, step 1105 comprises pushing the wings into the translation slots such that they situate within, and are can translate along, the translation slots. In one or more embodiments, this pushing engages a distal end of a coiled spring and compresses the same toward the rear wall and the studs about which the coiled springs are attached.

At step 1106, deformable clasp deformer/retainers are coupled to the fan receiver. In one or more embodiments, this step 1106 comprises passing recesses defined in the rear sides of the deformable clasp deformer/retainers over one or more snap fit protrusions disposed along the interior of the sidewalls of the fan receiver. The fan receiver assembly is now complete.

Figure 12:
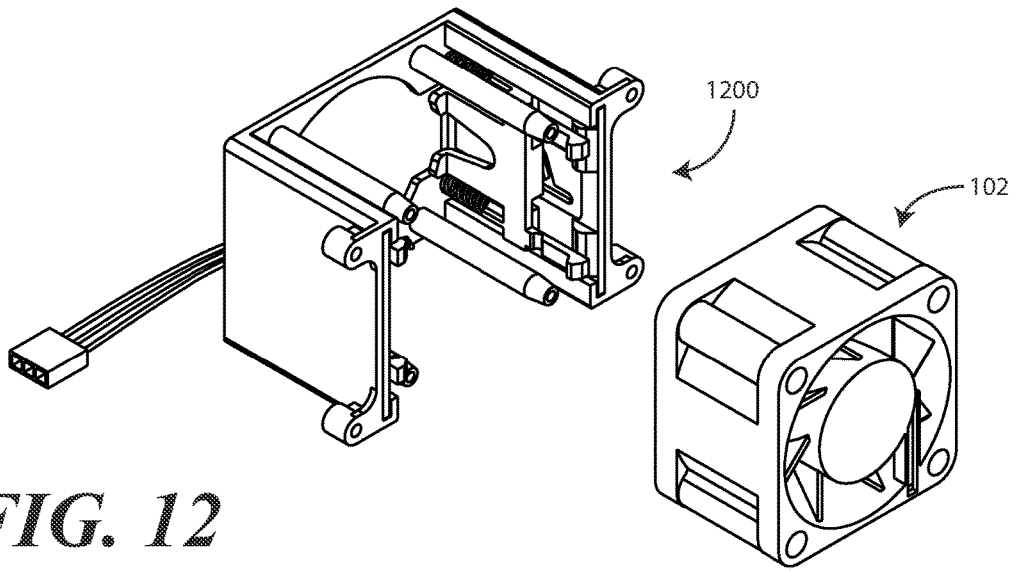
FIG. 12 illustrates one explanatory fan module and an explanatory fan receiver in accordance with one or more embodiments of the disclosure.

Turning now to FIGS. 12-23, illustrated therein are method steps associated with latching a fan module to a fan receiver assembly in accordance with one or more embodiments of the disclosure. Beginning with FIG. 12, illustrated therein are the fan receiver assembly 1200 of FIGS. 9-10 and the fan module 102 of FIG. 1. Each of the fan receiver assembly 1200 and fan module 102 are shown in perspective view.

Figure 13:
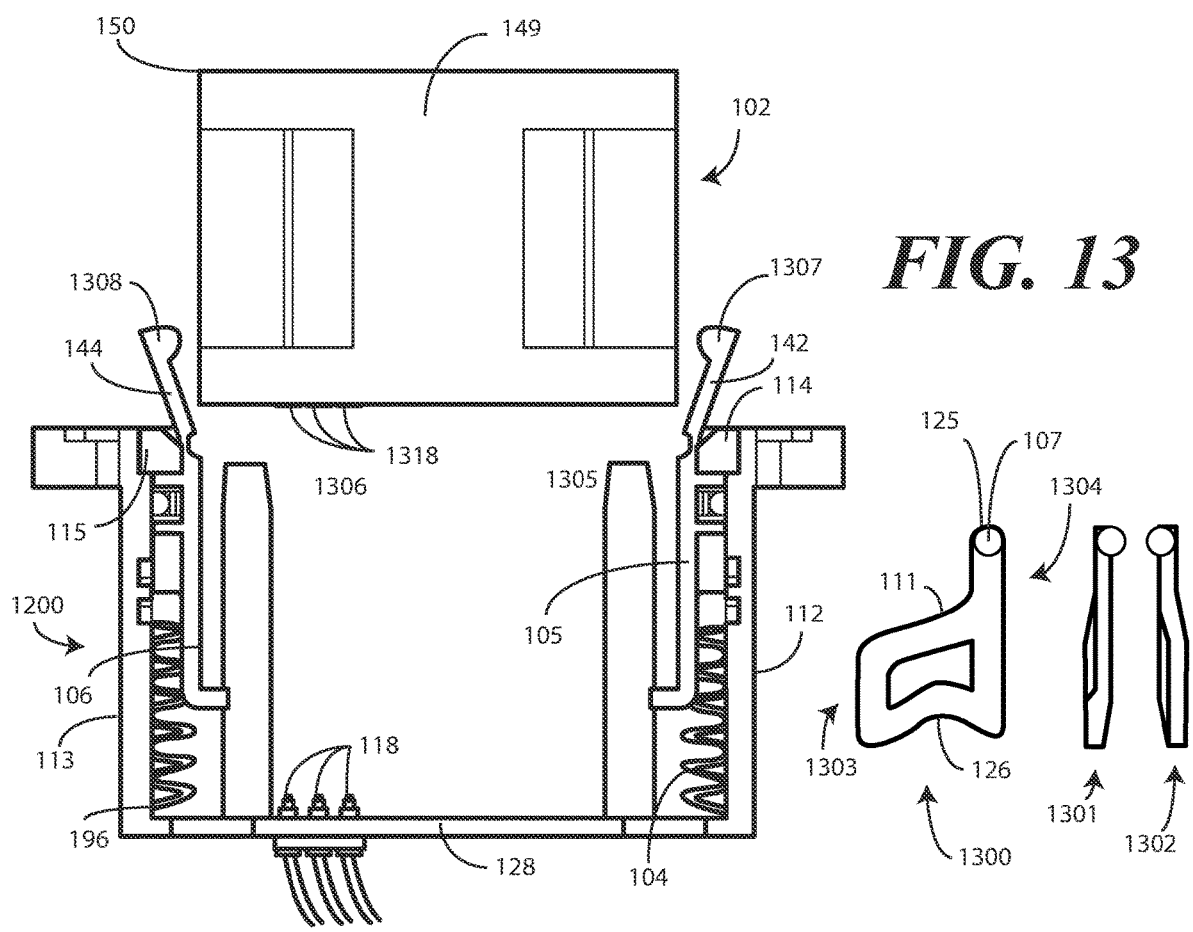
FIG. 13 illustrates one or more method steps for coupling an explanatory fan module to an explanatory fan receiver in accordance with one or more embodiments of the disclosure.

Turning now to FIG. 13, the fan receiver assembly 1200 and fan module 102 are also shown. So that the push-push latching and unlatching method can be more clearly described, the fan receiver assembly 1200 is shown in a partial sectional view, while the fan module 102 is shown in a side elevation view.

Also shown in FIG. 13 are three views 1300,1301,1302 of one of the d-tracks 111 (the other d-track is a mirror image of that shown in FIG. 13). The three views 1300,1301,1302 include a side elevation view 1300, a front elevation view 1301 from the front side 1303 of the d-track 111, and a rear elevation view 1302 of the rear side 1304 of the d-track 111. The front elevation view 1301 and the rear elevation view 1302 are provided so that changes in the depth to which the d-track 111 extends into the raised platforms (208,209) of the fan receiver assembly 1200 can be seen.

In FIG. 13, the fan module 102 is unlatched from, and physically separate from, the fan receiver assembly 1200. As shown, the coiled springs (103),104,(165),166 bias the deformable clasps 105,106 away from the rear wall 128 of the fan receiver assembly 1200. In one or more embodiments, the coiled springs (103),104,(165),166 cause the deformable clasps 105,106 to translate in the translation slots (116,117) away from the rear wall 128 of the fan receiver assembly 1200 until the bodies of the deformable clasps 105,106 abut the deformable clasp deformer/retainers 114,115. The deformable clasp deformer/retainers 114,115 thus retain the deformable clasps 105,106 within respective translation slots (116,117) during operation.

The d-track 111 serves as a guiding groove for the follower 107 to facilitate the push-push latching/ejection operation of the system 100. When the coiled springs (103),104,(165),166 cause the deformable clasps 105,106 to move away from the rear wall 128 of the fan receiver assembly 1200 until the bodies of the deformable clasps 105,106 abut the deformable clasp deformer/retainers 114, 115, this causes the follower 107 to situate in a terminal end 125 of the d-track 111. The terminal end 125 of the d-track 111 serves as the stoppage station for the follower 107 when the fan receiver assembly 1200 is in the unlatched position shown in FIG. 13. An outward notch 126 serves as a second stoppage station, as will be described in more detail below. The remainder of the d-track 111 functions as follower guides within which the followers 107 translates during translation of the fan module 102 into, and out of, the fan receiver assembly 1200.

As shown in FIG. 13, the latching arms (141),142,(143), 144 of each deformable clasp 105,106 is in an axially displaced open position. In one or more embodiments this occurs when the latching arms (141),142,(143),144 are extending beyond the terminal ends of the sidewalls 112, 113. This axially displaced open position is in contrast to the parallel position shown above in FIGS. 9-10, which occurred when the latching arms (141),142,(143),144 were situated between the sidewalls 112,113.

In one or more embodiments, each latching arm (141), 142,(143),144 includes a living hinge 1305,1306. In one or more embodiments, the living hinge 1305,1306 is located at the body of each deformable clasp 105,106. These living hinges 1305,1306 facilitate an articulated motion or deformation of each latching arm (141),142,(143),144 between the axially displaced open position and the parallel position to release, or engage, the fan module 102, respectively. In one or more embodiments, the latching arms (141),142, (143),144 extend beyond the terminal ends of the sidewalls 112,113 when the followers 107,(108) situate within the terminal ends 125 of the d-tracks 111.

In one or more embodiments each latching arm 141,142, 143,144 includes a latch 1307,1308 located at an end opposite the living hinge 1305,1306. In one or more embodiments, the latch 1307,1308 clasps about an edge 150 of the housing 149 of the fan module 102 to secure the fan module 102 within the fan receiver assembly 1200 when the fan module 102 is latched to the fan receiver assembly 1200.

Also shown in FIG. 13 are the one or more spring-biased electrical connectors 118, which are mechanically coupled to the fan receiver 101 and are electrically coupled to one or more wires 119 attached to a cable harness. The fan module 102 includes one or more complementary electrical connectors 1318. In this illustrative embodiment, the one or more complementary electrical connectors 1318 are configured as conductive pads that are exposed along the housing 140 of the fan module. When the fan module 102 latches to the fan receiver assembly 1200, these complementary electrical connectors 1318 contact and are biased against the one or more spring-biased electrical connectors 118 to form an electrical connection. This allows electricity to flow from the one or more spring-biased electrical connectors 118 to the one or more complementary electrical connectors 1318 to power the motor of the fan module. Since the connection between the one or more spring-biased electrical connectors 118 and the one or more complementary connectors 1318 is a pressure contact connection, the combination of the spring-biased electrical connectors 118 and the complementary electrical connectors provides the benefit of an electrical "quick connect" feature to facilitate an electrical connection between the motor of the fan module 102 and the power supply to which the wire harness (120) is connected.

Figure 14:
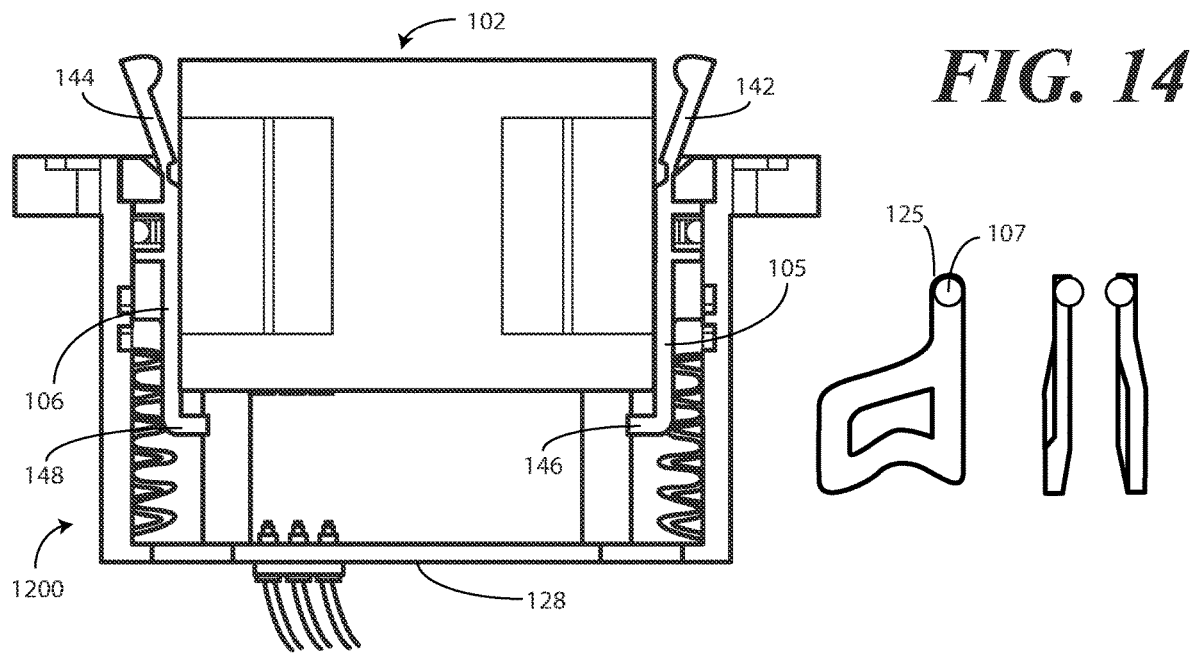
FIG. 14 illustrates one or more method steps for coupling an explanatory fan module to an explanatory fan receiver in accordance with one or more embodiments of the disclosure.

Turning now to FIG. 14, the fan module 102 is now being pushed toward the rear wall 128 of the fan receiver assembly 1200 to initiate the latching process. This causes the fan module 102 to pass between the bodies of the deformable clasps 105,106. However, the fan module 102 has not yet reached the L-shaped feet (145),146,(147),148 extending distally from the deformable clasp 105,106 in a direction opposite that of the latching arms (141),142,(143),144. Accordingly, the followers 107,(108) are still situated at the terminal ends 125 of the d-tracks 111, while the latching arms (141),142,(143),144 of each deformable clasp 105,106 remain in the axially displaced open position.

Figure 15:
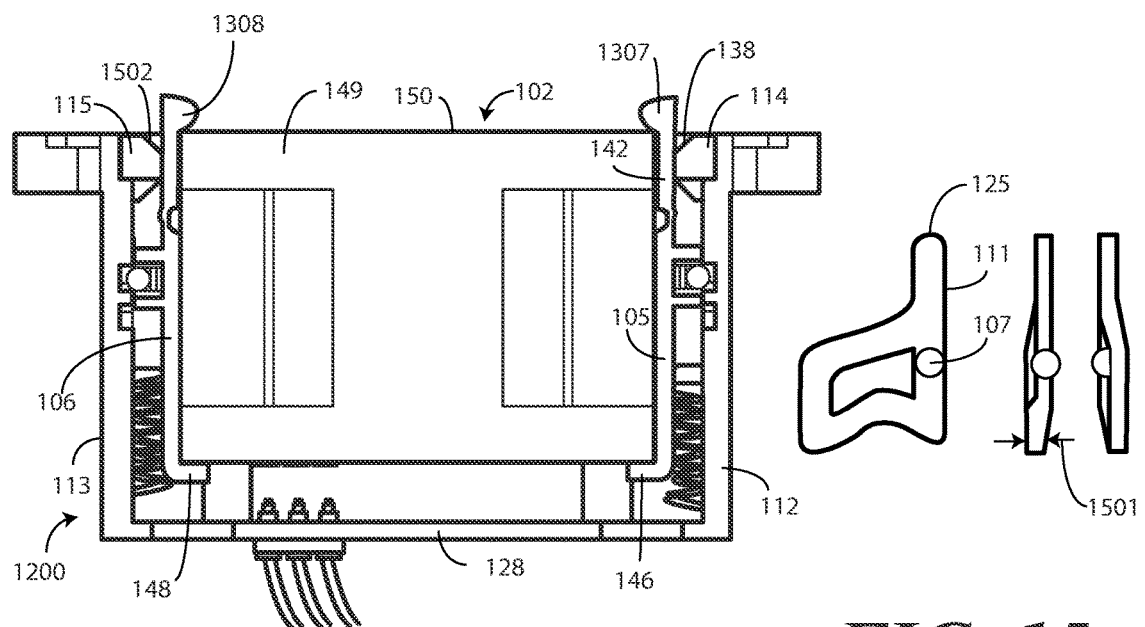
FIG. 15 illustrates one or more method steps for coupling an explanatory fan module to an explanatory fan receiver in accordance with one or more embodiments of the disclosure.

Turning now to FIG. 15, the fan module 102 continues to be pushed toward the rear wall 128 of the fan receiver assembly 1200 to continue the latching process. Now, however, the fan module 102 has reached and engaged the L-shaped feet (145),146,(147),148, thereby causing the deformable clasps 105,106 to also translate toward the rear wall 128 of the fan receiver assembly 1200. This causes the followers 107,(108) to translate along the long leg of the d-track 111 away from the terminal end 125.

In one or more embodiments, to ensure that the followers (107,108) travel along the d-tracks 111 in only one direction, the depth 1501 of the d-tracks 111 changes. Recall from above that when the flat springs (109,110) are situated between the followers 107,(108) and the inner surface of the blind slots (165) of the deformable clasps 105,106 the flat springs (109,110) bias the followers 107,(108) outwardly from the blind slot (165). The bottom wall of the d-tracks 111 compresses the flat springs (109,110), with the loading force biasing the followers 107,(108) into the d-tracks 111. This biasing force, combined with the changing depth 1501 of the d-tracks 111 ensures that motion of the followers 107,(108) occurs in a single direction.

Since the deformable clasps 105,106 are translating toward the rear wall 128 of the fan receiver assembly 1200, the deforming action of the deformable clasp deformer/retainers 114,115 can be seen. Specifically, the arm deformers 137,1502 cause corresponding latching arms (141),142, (143),144 of each deformable clasp 105,106 to transition from the axially displaced open position of FIG. 14 that occurs the latching arms (141),142,(143),144 extend beyond the terminal ends of the sidewalls 112,113 to the parallel position of FIG. 15 that occurs the latching arms (141),142, (143),144 are situated between the sidewalls 112,113. Said differently, in one or more embodiments the latching arms (141),142,(143),144 pivot relative to the deformable clasps 105,106 from the axially displaced open position occurring when the one latching arms (141),142,(143),144 extend beyond a terminal end of the first sidewall 112 or the second sidewall 113 and to the parallel position occurring when the latching arms (141),142,(143),144 are situated between the terminal ends of the first sidewall 112 or the second sidewall 113 and the rear wall 128.

In one or more embodiments, this causes the latches 1307,1308 to clasp about an edge 150 of the housing 149 of the fan module 102. In one or more embodiments, this clasping action performs two functions: First, it pulls the housing 1409 of the fan module 102 into the fan receiver assembly 1200. Second, once latched, it secures the fan module 102 within the fan receiver assembly 1200.

Figure 16:
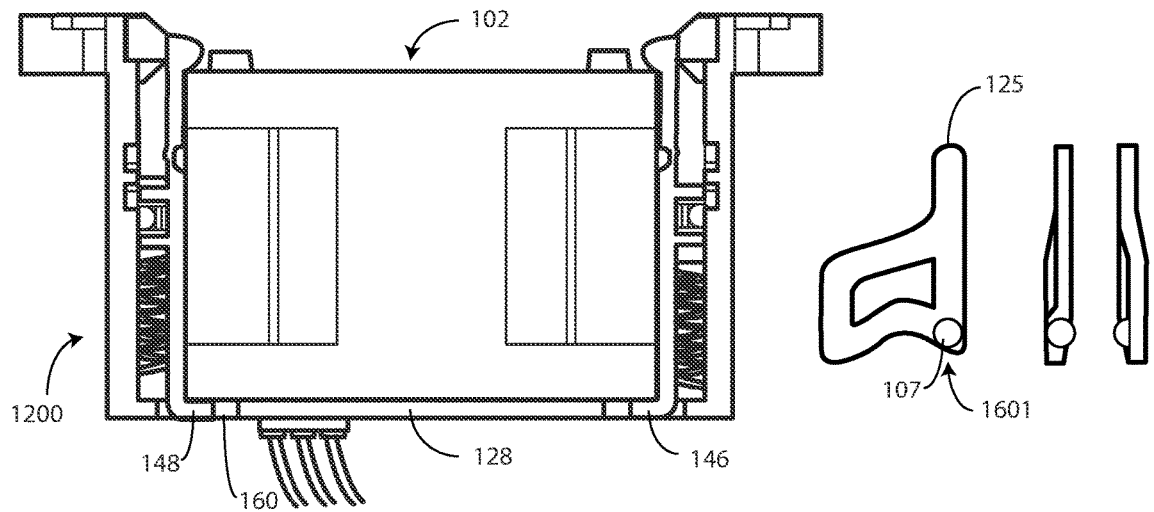
FIG. 16 illustrates one or more method steps for coupling an explanatory fan module to an explanatory fan receiver in accordance with one or more embodiments of the disclosure.

Turning now to FIG. 16, the fan module 102 is pushed toward the rear wall 128 of the fan receiver assembly 1200 to the point where the L-shaped feet (145),146,(147),148 pass into the aperture 160. In one or more embodiments, this causes followers 107,(108) to translate along the long leg of the d-track 111 to a distal end 1601 disposed at an end of the long leg that is opposite from the terminal end 125.

In one or more embodiments this causes the one or more spring-biased electrical connectors (118) to contact one or more complementary electrical connectors (1318). The compressive action of pushing the fan module 102 toward the rear wall 128 of the fan module receiver causes the one or more complementary electrical connectors (1318) to compress the springs of the one or more spring-biased electrical connectors (118), thereby forming an electrical connection that allows electricity to flow from the one or more spring-biased electrical connectors (118) to the one or more complementary electrical connectors (1318) to power the motor of the fan module.

Figure 17:
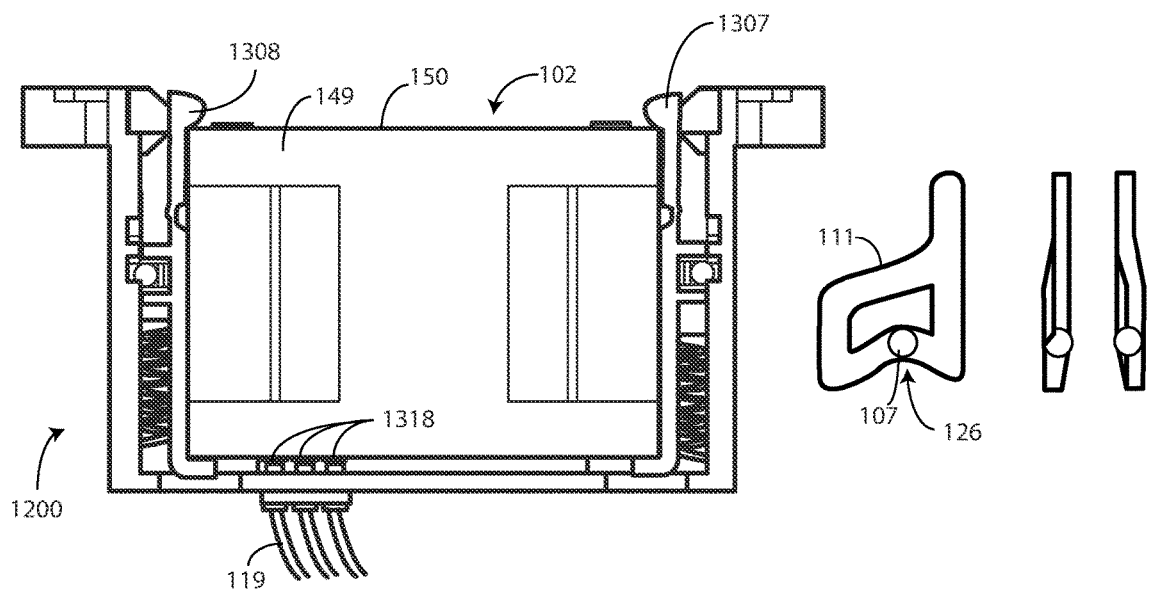
FIG. 17 illustrates a sectional view of one explanatory fan coupled to one explanatory fan receiver in accordance with one or more embodiments of the disclosure.
Figure 18:
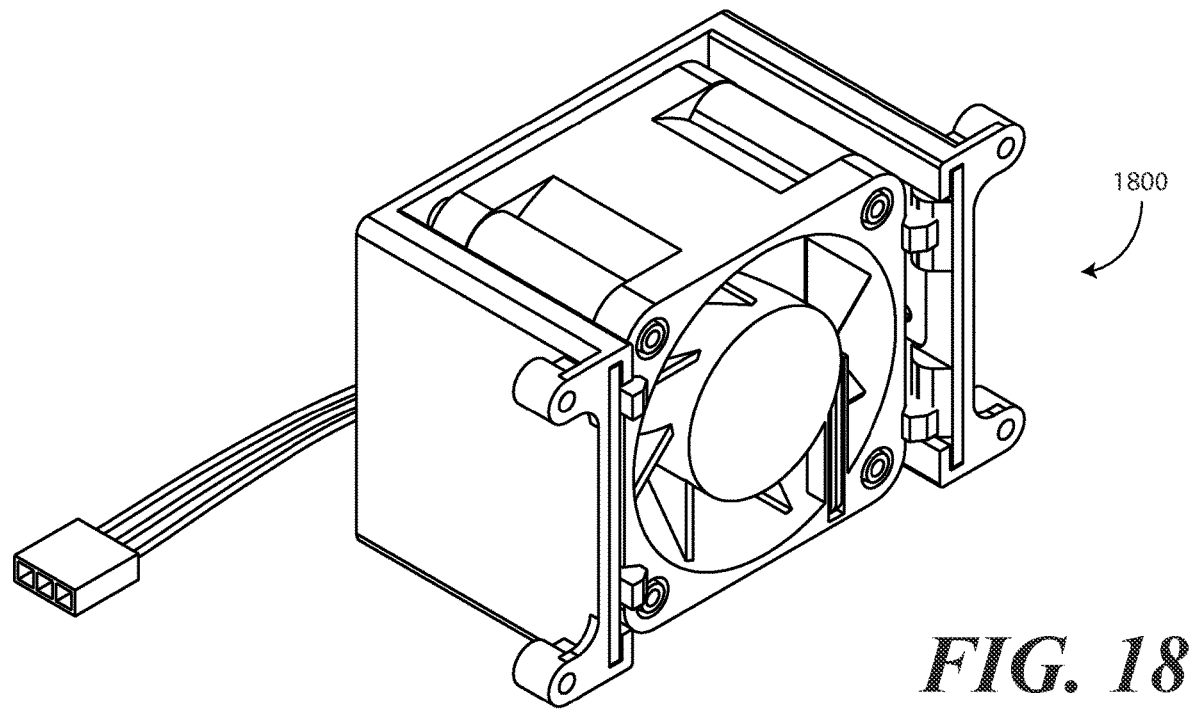
FIGS. 18 and 19 illustrate perspective views of one explanatory fan coupled to one explanatory fan receiver in accordance with one or more embodiments of the disclosure.
Figure 19:
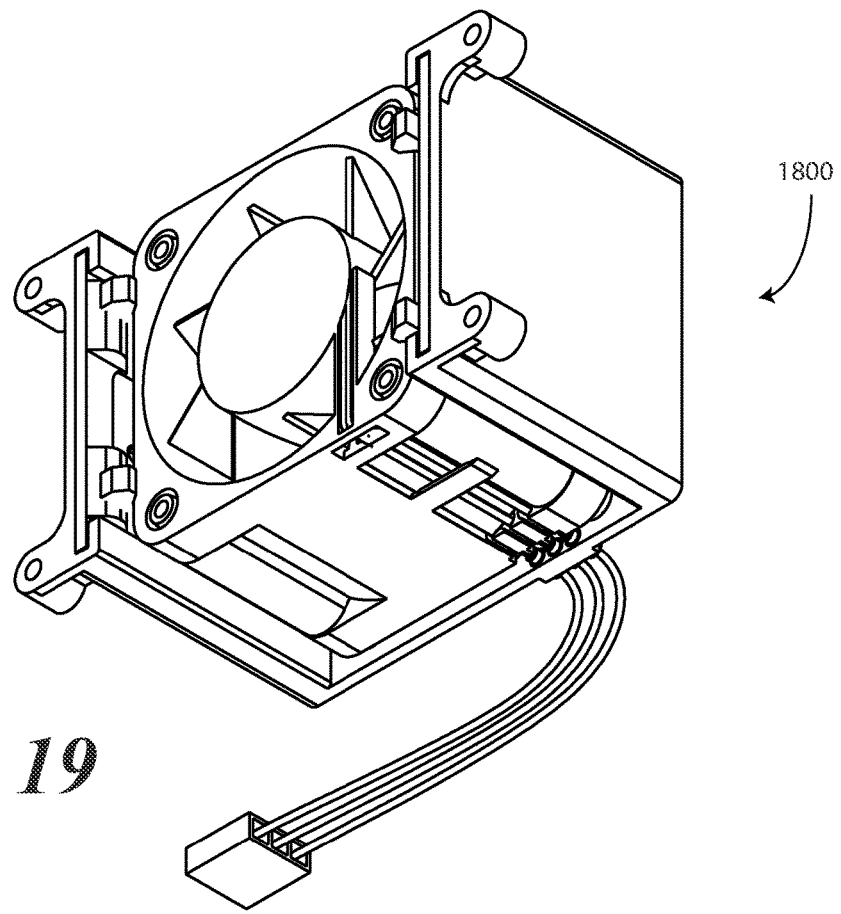

Turning now to FIG. 17, releasing the fan module, i.e., allowing the one or more springs (103),104,(105),106 to push the fan module 102 away from the rear wall 128 of the fan receiver assembly 1200, causes the followers 107,(108) to translate around the round portion of the d-track 111. As shown in FIG. 17, once the followers 107,(108) reach the outward notches 126 of the d-tracks 111, the fan module 102 is latched within the fan receiver assembly 1200. This occurs due to the fact that the outward notches 126 serve as stoppage stations for the latched condition of the fan receiver assembly 1200. The latches 1307,1308 clasp about an edge 150 of the housing 149 of the fan module 102 to secure the fan module 102 within the fan receiver assembly 1200 in this latched configuration 1800. The latched configuration 1800 is shown in FIGS. 18-19.

As shown in FIG. 17, the one or more spring-biased electrical connectors 118 are biased against the one or more complementary electrical connectors 1318. When the fan module 102 latches to the fan receiver assembly 1200, these complementary electrical connectors 1318 contact and are biased against the one or more spring-biased electrical connectors 118 to form an electrical connection allowing electricity to flow from the one or more spring-biased electrical connectors 118 to the one or more complementary electrical connectors 1318 to power the motor of the fan module 102. Advantageously, the one or more spring-biased electrical connectors 118 and the one or more complementary connectors 1318 create a pressure contact connection that provides the benefit of an electrical "quick connect" feature to facilitate an electrical connection between the motor of the fan module 102 and the power supply to which the wire harness (120) is connected.

Figure 20:
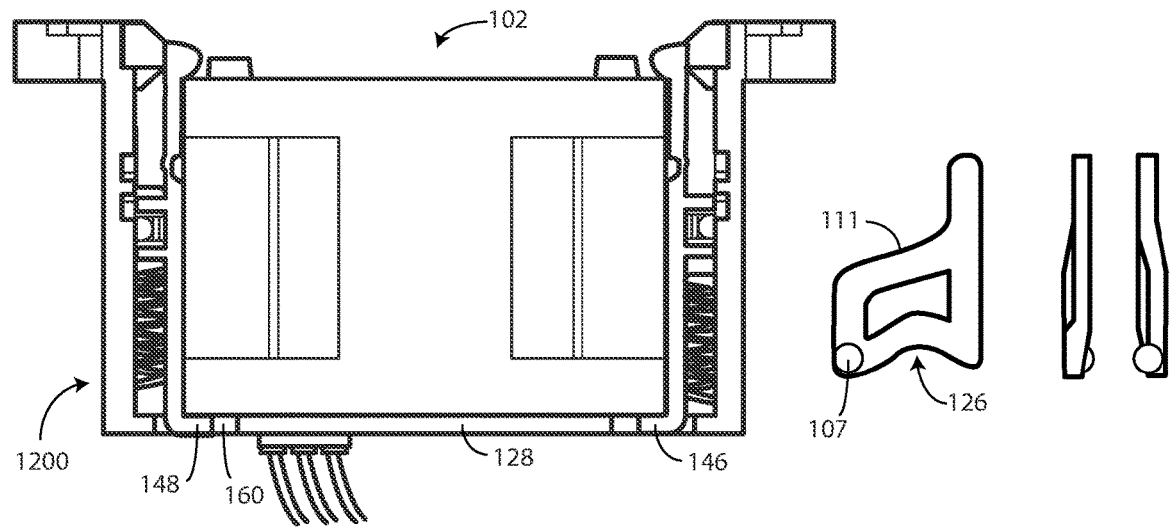
FIG. 20 illustrates one or more method steps for decoupling an explanatory fan module from an explanatory fan receiver in accordance with one or more embodiments of the disclosure.

FIGS. 20-23 then illustrate the unlatching process required to return to the unlatched configuration of FIG. 13. Turning now to FIG. 20, the fan module 102 is pushed toward the rear wall 128 of the fan receiver assembly 1200 to the point where the L-shaped feet (145),146,(147),148 pass into the aperture 160. In one or more embodiments, this causes followers 107,(108) to translate along the round portion of the d-track 111 outward and away from the outward notch 126. Accordingly, as with the latching method, the unlatching method is initiated with a pressing motion. Hence the mechanism being referred to as a "push-push" system.

Figure 21:
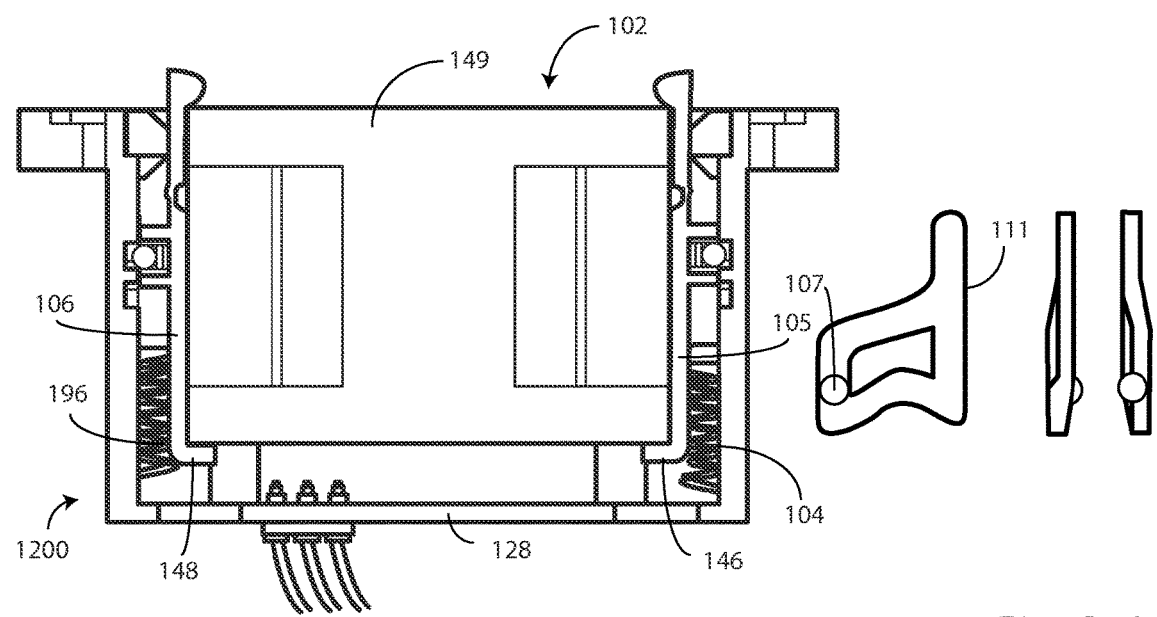
FIG. 21 illustrates one or more method steps for decoupling an explanatory fan module from an explanatory fan receiver in accordance with one or more embodiments of the disclosure.

Turning now to FIG. 21, the coiled springs (103),104, (105),106 begin to work to eject the fan module 102 from the fan receiver assembly 1200. This causes the fan module 102 to be pushed away from the rear wall 128 of the fan receiver assembly 1200 in continuance of the unlatching process. The L-shaped feet (145),146,(147),148 are biased against the housing 149 of the fan module 102, thereby allowing the deformable clasps 105,106 to translate the fan module 102 away from the rear wall 128 of the fan receiver assembly 1200. This causes the followers 107,(108) to translate along the round portion of the d-track 111 back toward the long leg of the d-track 111.

Figure 22:
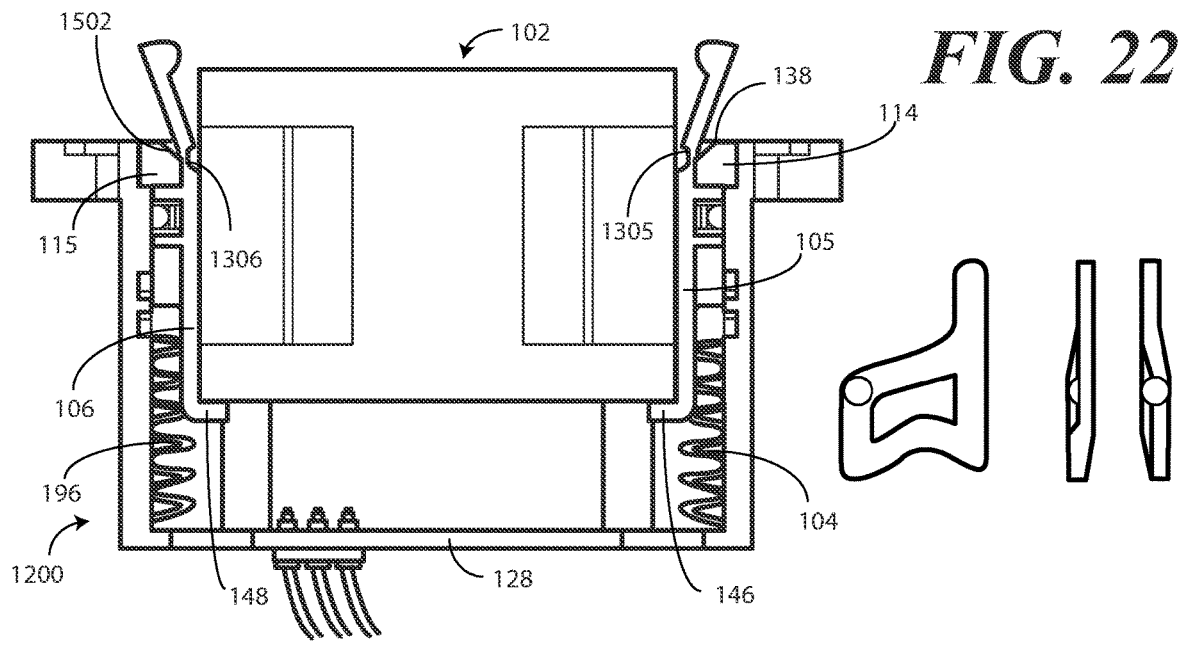
FIG. 22 illustrates one or more method steps for decoupling an explanatory fan module from an explanatory fan receiver in accordance with one or more embodiments of the disclosure.

Turning now to FIG. 22, the coiled springs (103),104, (105),106 continue to eject the fan module 102 from the fan receiver assembly 1200. The L-shaped feet (145),146,(147), 148 translate the fan module 102 away from the rear wall 128 of the fan receiver assembly 1200.

Since the deformable clasps 105,106 are translating away from the rear wall 128 of the fan receiver assembly 1200, the living hinges 1305,1306 pass by the arm deformers 138, 1502. This allows the latching arms (141),142,(143),144 to spread from the parallel position of FIG. 21 back to the axially displaced open position.

Figure 23:
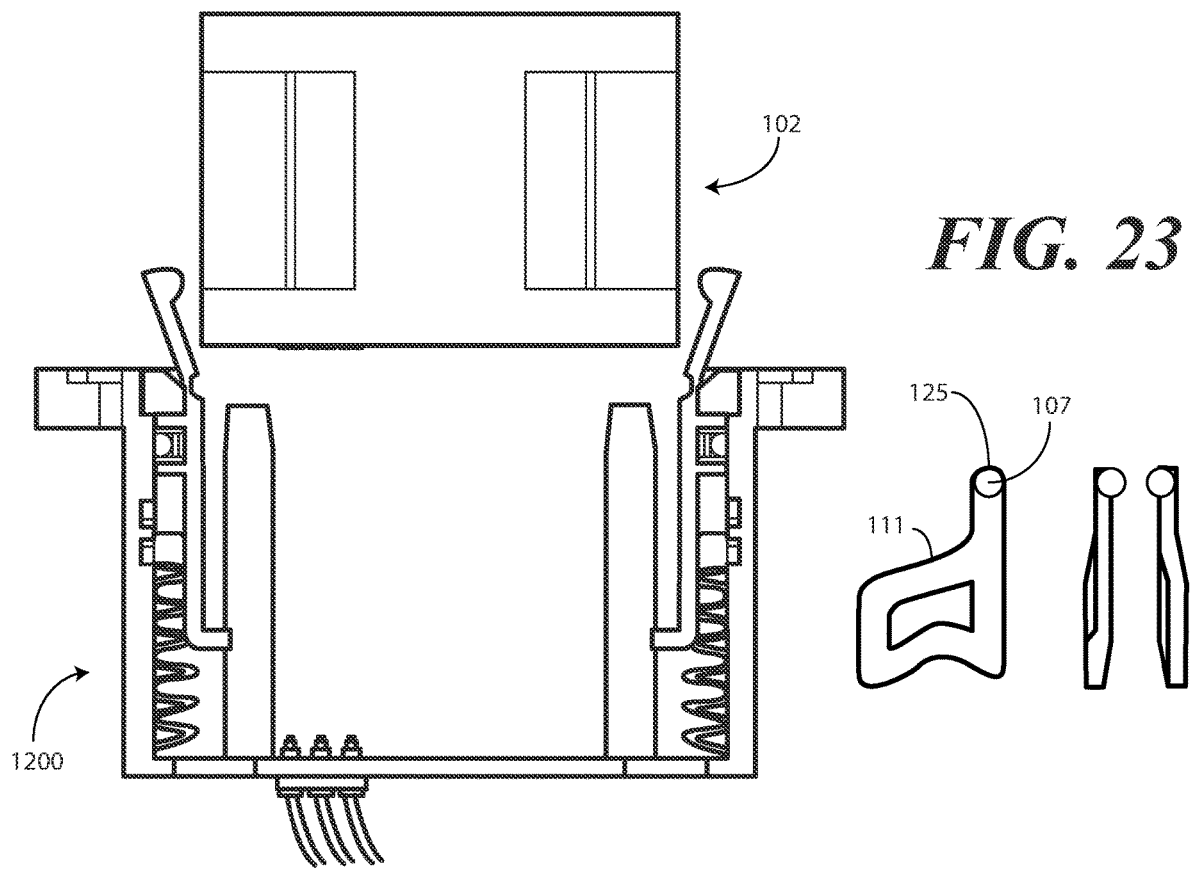
FIG. 23 illustrates one or more method steps for decoupling an explanatory fan module from an explanatory fan receiver in accordance with one or more embodiments of the disclosure.

Turning now to FIG. 23, the ejection process continues until the followers 107,(108) reach the terminal ends 125 of the d-tracks 111. The fan module can then be removed from the fan receiver assembly 1200.

Figure 24:
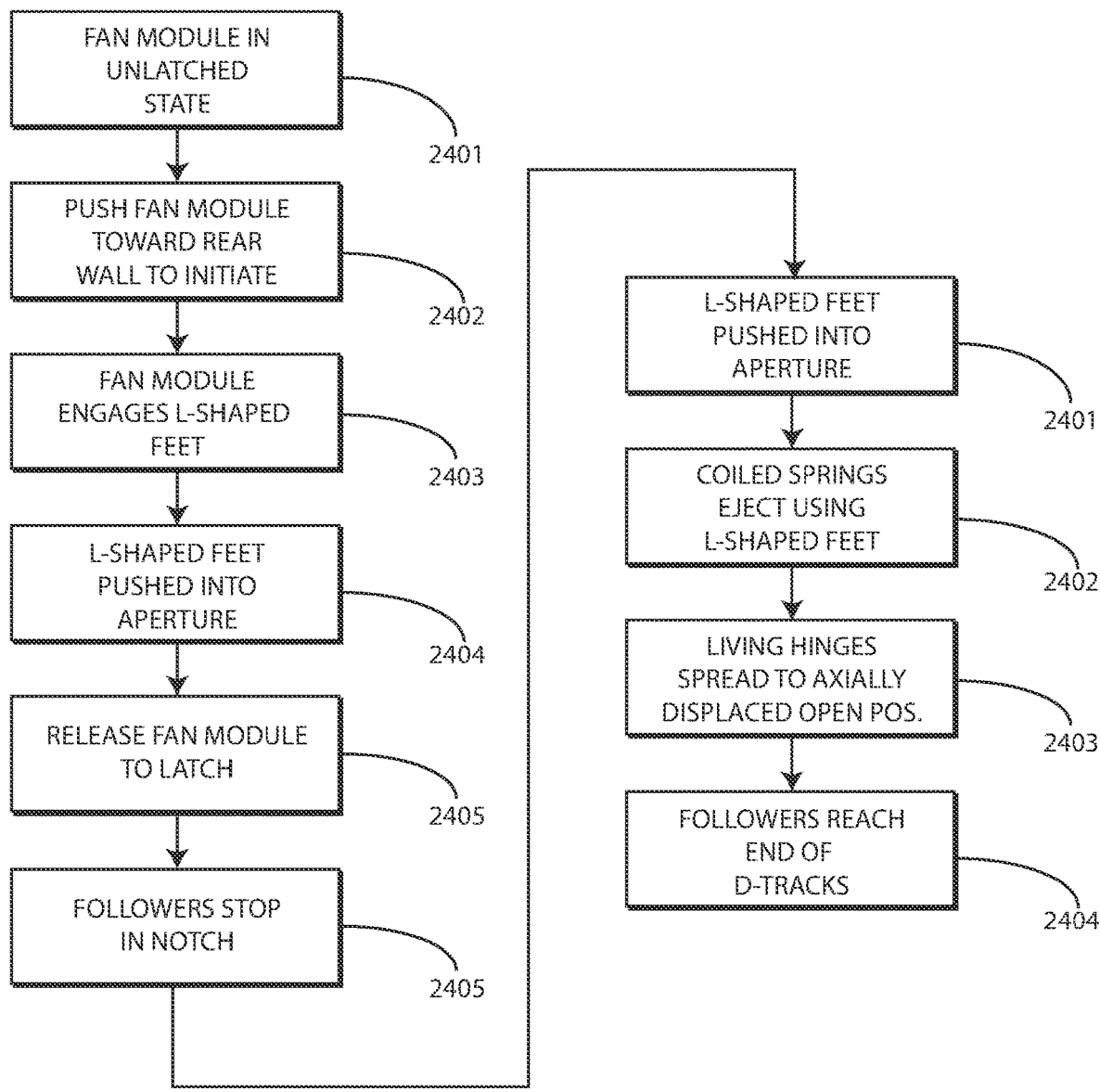
FIG. 24 illustrates one explanatory method of latching and unlatching a fan to a fan receiver in accordance with one or more embodiments of the disclosure.

Turning now to FIG. 24, illustrated therein is one explanatory method 2400 summarizing the steps illustrated and described above with reference to FIGS. 13-23. At step 2401, a fan receiver assembly and fan module are in an unlatched condition. The fan module is unlatched from, and physically separate from, the fan receiver assembly. Coiled springs of the fan receiver assembly bias the deformable clasps away from the rear wall until the bodies of the deformable clasps abut the deformable clasp deformer/retainers. The followers situate at terminal ends of the d-tracks. The latching arms of each deformable clasp are in an axially displaced open position.

At step 2402, the fan module is pushed toward the rear wall of the fan receiver assembly to initiate the latching process. This causes the fan module to pass between the bodies of the deformable clasps.

At step 2403, the fan module engages the L-shaped feet, thereby causing the deformable clasps to translate toward the rear wall of the fan receiver assembly. This causes the followers to translate along the long leg of the d-track away from the terminal end. The deformable clasp deformer/retainers, by way of the arm deformers, cause corresponding latching arms to transition from the axially displaced open position to the parallel position. In one or more embodiments, this causes the latches to clasp about an edge of the housing of the fan module.

At step 2404, the fan module is pushed toward the rear wall of the fan receiver assembly to the point where the L-shaped feet pass into the aperture. At step 2405, the fan module is released, thereby allowing the one or more springs to push the fan module away from the rear wall. At step 2406, the followers stop this push in a latched configuration when they reach the outward notches of the d-tracks. This latches the fan module within the fan receiver assembly.

At step 2407, the fan module is pushed toward the rear wall of the fan receiver assembly to the point where the L-shaped feet pass into the aperture to initiate the unlatching process. In one or more embodiments, this causes followers to translate along the round portion of the d-track outward and away from the outward notch.

At step 2408, the coiled springs work to eject the fan module from the fan receiver assembly when L-shaped feet bias against the body to translate the fan module away from the rear wall of the fan receiver assembly. This causes the followers to translate along the round portion of the d-track back toward the long leg of the d-track.

At step 2409, the living hinges pass by the arm deformers causing the latching arms to spread from the parallel position back to the axially displaced open position. At step 2410 the followers reach the terminal ends of the d-tracks. The fan module can then be removed from the fan receiver assembly.

Embodiments of the disclosure are novel and non-obvious over prior art fan systems. For example, consider U.S. Pat. No. 4,792,165. This reference discloses a push latch device that includes a case and a slider. The slider slides into and out of the case. The movement of the slider is controlled by a guide mechanism disposed between the slider and the case.

The guide mechanism consists of an annular guide passageway formed in a one side inner surface of the case and a guide lever having a guide member which moves along the guide passageway while being pressed against the sidewall thereof. The guide passageway is formed with a substantially V-shaped stoppage portion for stopping the slider within the case. The guide lever has a support spindle formed with a flat surface having an angle to the longitudinal direction of the guide lever to impart forces for pressing the sidewall of the guide passageway, with the guide lever rotating about the support spindle. The rotary moment is imparted to the guide lever by pushing the support spindle by a coil spring for moving the slider.

Embodiments of the disclosure are distinct over the '165 patent. With embodiments of the disclosure, different states or positions are provided within the push-push latching mechanism. The complete interaction of the push-push latch with the fan, further interacting with the spring-biased electrical connectors distinguish embodiments of the disclosure from the '165 patent. Another distinction lies in the configuration of the hook, the '165 patent holds an engagement projection. By contrast, the fan receiver of embodiments of the disclosure has the task to support the complete fan module.

Next, consider U.S. Pat. No. 8,050,021. This reference teaches an ejectable/retractable interface module that includes a display trolley assembly. A display module is pivotally connected to the display trolley assembly. A management cable connects the display module to a computer board in the display trolley assembly. The display trolley assembly and display module are configured for ejection and retraction in a blade enclosure, with the display module folding flat and retracting into the blade enclosure to reduce damage during shipping. The display module pivots to a desired viewing angle during use.

Embodiments of the disclosure are distinct over the '021 patent. Embodiments of the disclosure are designed for application in products using a fan with standard frame size and with the requirement of being replaced when and where needed. Embodiments of the disclosure are not designed for use with displays. Moreover, embodiments of the disclosure do not use any pivot feature to complete the attachment.

Now consider U.S. Pat. No. 6,010,344. This reference teaches a motor driven ejection system responsive to control signals to allow the insertion and/or ejection of a card under computer automatic control. The ejection system has a motor responsive to control signals to cause forward/reverse movements of the motor or render the motor stationary. The insertion and the ejection of a card is completely dominated by a computer and not susceptible to any operator interaction that might otherwise damage or distort information on the card.

Embodiments of the disclosure are distinct over the '344 patent. With embodiments of the disclosure, the mechanism includes different components that are assisted with coil springs. Embodiments of the disclosure do not use motors of any kind. Nor are control signals needed since there are only two states or position, namely, a latched position and an unlatched position.

Figure 25:
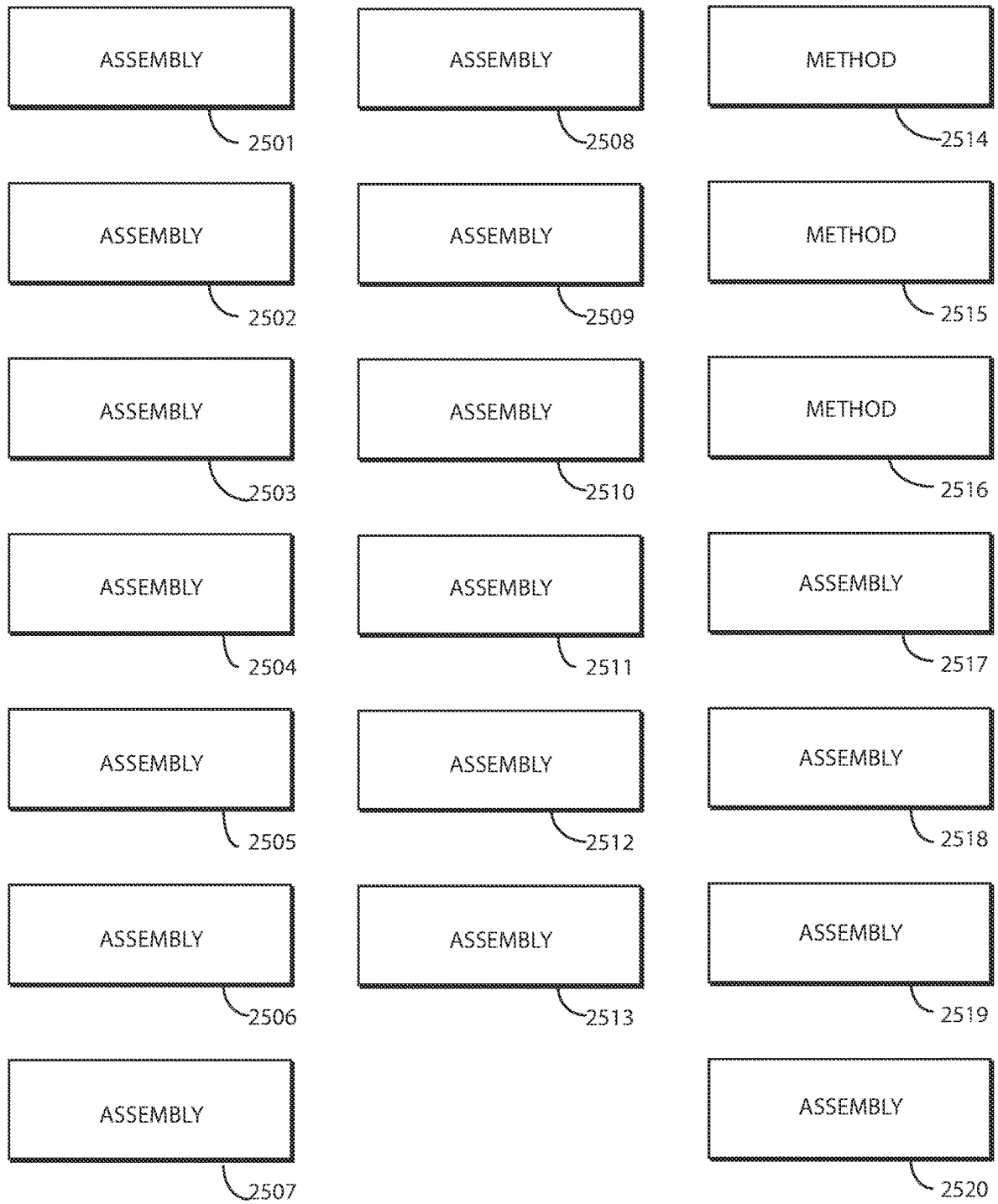
FIG. 25 illustrates various embodiments of the disclosure.

Turning now to FIG. 25, illustrated therein are various embodiments of the disclosure. At 2501, a fan receiver assembly comprises a fan receiver. At 2501, the fan receiver comprises a rear wall and at least one sidewall.

At 2501, the fan receiver comprises at least one deformable clasp coupled to, and translatable along, the at least one sidewall. At 2501, the at least one deformable clasp comprises at least one latching arm pivotable relative to the at least one deformable clasp between an axially displaced open position occurring when the at least one latching arm extends beyond a terminal end of the at least one sidewall and a parallel position occurring when the at least one latching arm is situated between the terminal end and the rear wall.

At 2502, the fan receiver assembly of 2501 further comprises one or more coiled springs biasing the at least one deformable clasp away from the rear wall. At 2503, the at least one latching arm of 2502 comprises a living hinge. At 2053, the at least one latching arm is pivotable between the axially displaced open position and the parallel position about the living hinge.

At 2504, the at least one sidewall of 2502 defines a d-track comprising a terminal end and an outward notch. At 2504, the fan receiver assembly further comprises a follower situated within the d-track between the at least one deformable clasp and the at least one sidewall.

At 2505, the at least one deformable clasp of 2504 defines a blind slot. At 2505, the fan receiver assembly further comprises a flat spring situated in the blind slot and biasing the follower into the d-track recess.

At 2506, the terminal end and the outward notch of the d-track of 2505 define stoppage stations for the follower when the at least one latching arm pivotable is in the axially displaced open position and the parallel position, respectively.

At 2507, the at least one latching arm of 2504 pivots to the axially displaced open position when the follower situates in the terminal end. At 2507, the at least one latching arm of 2504 pivots to the parallel position when the follower situated in the outward notch.

At 2508, the at least one sidewall of 2505 comprises a pair of oppositely facing L-shaped rails defining a translation slot. At 2508, the at least one deformable clasp comprising wings situated in, and translatable along, the translation slot.

At 2509, the at least one deformable clasp of 2508 comprises one or more L-shaped feet extending distally from the at least one deformable clasp in a direction opposite that of the at least one latching arm. At 2510, the fan receiver assembly of 2508 further comprises at least one deformable clasp deformer/retainer retaining the wings of the at least one deformable clasp within the translation slot.

At 2511, the at least one deformable clasp deformer/retainer of 2510 defines one or more recesses. At 2511, the at least one sidewall comprises one or more snap fit protrusions situated within the one or more recesses.

At 2512, the at least one deformable clasp deformer/retainer of 2511 comprises at least one arm deformer causing the at least one latching arm the at least one deformable clasp to pivot from the axially displaced open position to the parallel position when the wings translate within the translation slot toward the rear wall. At 2513, the fan receiver assembly of 2514 further comprises one or more bosses extending distally from the rear wall from a base at the rear wall a distal end defining an inward taper.

At 2514, a method of assembling a fan receiver assembly comprises providing a fan receiver comprising two sidewalls and a rear wall interspacing the two sidewalls. At 2514, each of the first sidewall and the second sidewall comprises a raised platform and a d-track recessed into the raised platform. At 2514, each of the first sidewall and the second sidewall comprises a pair of L-shaped rails defining a translation slot.

At 2514, the method comprises placing one or more coiled springs into a cavity defined by the rear wall and the two sidewalls. At 2514, the method comprises placing a first follower and a first flat spring a blind slot of a first deformable clasp and a second follower and second flat spring another blind slot of a second deformable clasp. At 2514, the method comprises coupling the first deformable clasp and the second deformable clasp to the fan receiver by inserting wings of the first deformable clasp and the second deformable clasp with the translation slot of the first sidewall and the second sidewall, respectively, thereby causing the first follower to be biased in the d-track of the first raised platform and the second follower to be biased in the d-track of the second raised platform.

At 2515, the method of 2514 further comprises coupling a first deformable clasp deformer/retainer to the first sidewall and a second deformable clasp deformer/retainer to the second sidewall by passing recesses defined in the rear sides of the first deformable clasp deformer/retainer and the second deformable clasp deformer/retainer over snap fit protrusions disposed along interiors of the first sidewall and the second sidewall. At 2516, the method of 2515 comprises coupling one or more spring-biased electrical connectors to the rear wall.

At 2517, a fan receiver assembly comprises a rear wall, a first sidewall extending distally from a first end the rear wall, and a second sidewall extending distally from a second, opposite end of the rear wall. At 2517, a first deformable clasp is coupled to, and translatable along, the first sidewall. At 2517, a second deformable clasp is coupled to, and translatable along, the second sidewall.

At 2517, one or more coiled springs bias the first deformable clasp away from the rear wall. At 2517, one or more other coiled springs bias the second deformable clasp away from the rear wall.

At 2517, the first deformable clasp and the second deformable clasp each comprise one or more latching arms that are pivotable between an axially displaced open position occurring when the one or more latching arms extend beyond terminal ends of the first sidewall and the second sidewall and a parallel position occurring when the one or more latching arms are situated between the first side wall and the second sidewall.

At 2518, the fan receiver assembly of 2517 further comprises one or more spring-biased electrical connectors coupled to the rear wall. At 2518, the fan receiver assembly of 2517 further comprises a fan module, latched to the fan receiver assembly, and comprising one or more complementary electrical connectors.

At 2519, each of the first sidewall and the second sidewall of 2518 comprise a d-track. At 2519, the d-track comprises a terminal end and an outward notch. At 2519, the fan receiver assembly further comprises a first follower biased from the first deformable latch into the d-track of the first sidewall and a second follower biased from the second deformable latch into the d-track of the second sidewall. At 2520, the one or more latching arms of 2519 each comprise at least one latch and at least one L-shaped foot latching the fan module to the fan receiver assembly when the first follower and the second follower situate within the outward notch of the d-track of the first sidewall and the second sidewall, respectively, with the one or more complementary electrical connectors electrically coupled to the one or more spring-biased electrical connectors.

Embodiments of the disclosure, as illustrated above, define novel elements differentiating the embodiments from related art. For example, the "push-push" mechanism for latching an unlatching the fan module to the fan receiver assembly, in combination with spring-biased electrical connectors making an electrical connection to the complementary electrical connectors of the fan assembly provides novelty in the application of mechanisms and in providing a direct hot repair type of connection for use in fan mounting. Specific details on these mechanisms rather portray the mechanisms as part of an application. The details on mechanical configuration, including guide, snap, and living hinge details, are implemented for retaining the fan module in a mounting position. Collectively, these details are distinct from prior art designs.

Embodiments of the disclosure can be constructed and commercialized in a fan mount/application in a type of product conducive to a standard treatment or where product requirements are not stringent with respect to thermal management, e.g., where spatial requirements and required location of fans in a chassis are amenable to constructs described above. Variations of a product's requirements (such as spatial constraints, or specific fan placement within the product needed for thermal management or other specific requirements) can make prior art fan solutions more difficult to implement on a wide basis than are embodiments of the disclosure. Thermal management is very often a "custom" type solution due to these varying product requirements, for which embodiments of the disclosure are well suited. Embodiments of the disclosure are suitable for a standard for types of consistently defined enclosure/product types.

Embodiments of the disclosure provide a combination of a "push-push" latching mechanism and a direct connection of a fan module to a product's electrical interface. In addition, a "snap" type mechanism based on a living hinge molded design is used for fan retention. Novelty is also found in the application of using the push-push mechanism and direct fan connection for simplifying the connection of a fan to a chassis interface.

In the foregoing specification, specific embodiments of the present disclosure have been described. However, one of ordinary skill in the art appreciates that various modifications and changes can be made without departing from the scope of the present disclosure as set forth in the claims below. Thus, while preferred embodiments of the disclosure have been illustrated and described, it is clear that the disclosure is not so limited. Numerous modifications, changes, variations, substitutions, and equivalents will occur to those skilled in the art without departing from the spirit and scope of the present disclosure as defined by the following claims.

Accordingly, the specification and figures are to be regarded in an illustrative rather than a restrictive sense, and all such modifications are intended to be included within the scope of present disclosure. The benefits, advantages, solutions to problems, and any element(s) that may cause any benefit, advantage, or solution to occur or become more pronounced are not to be construed as a critical, required, or essential features or elements of any or all the claims.

What is claimed is:

1. A fan receiver assembly, comprising:
a fan receiver comprising a rear wall and at least one sidewall; and
at least one deformable clasp coupled to, and translatable along, the at least one sidewall, and one or more coiled springs biasing the at least one deformable clasp away from the sidewall, the at least one deformable clasp comprising at least one latching arm pivotable relative to the at least one deformable clasp between an axially displaced open position occurring when the at least one latching arm extends beyond a terminal end of the at least one sidewall and a parallel position occurring when the at least one latching arm is situated between the terminal end and the rear wall, where the at least one sidewall defines a d-track comprising a terminal end and an outward notch, further comprising a follower situated within the d-track between the at least one deformable clasp and the at least one sidewall.

2. The fan receiver assembly of claim 1, the at least one latching arm comprising a living hinge, the at least one latching arm pivotable between the axially displaced open position and the parallel position about the living hinge.

3. The fan receiver assembly of claim 1, the at least one deformable clasp defining a blind slot, further comprising a flat spring situated in the blind slot and biasing the follower into the d-track.

4. The fan receiver assembly of claim 3, the terminal end and the outward notch defining stoppage stations for the follower when the at least one latching arm pivotable is in the axially displaced open position and the parallel position, respectively.

5. The fan receiver assembly of claim 1, the at least one latching arm pivoting to the axially displaced open position when the follower situates in the terminal end, and pivoting to the parallel position when the follower situated in the outward notch.

6. The fan receiver assembly of claim 3, the at least one sidewall comprising a pair of oppositely facing L-shaped rails defining a translation slot, the at least one deformable clasp comprising wings situated in, and translatable along, the translation slot.

7. The fan receiver assembly of claim 6, the at least one deformable clasp comprising one or more L-shaped feet extending distally from the at least one deformable clasp in a direction opposite that of the at least one latching arm.

8. The fan receiver assembly of claim 6, further comprising at least one deformable clasp deformer/retainer retaining the wings of the at least one deformable clasp within the translation slot.

9. The fan receiver assembly of claim 8, the at least one deformable clasp deformer/retainer defining one or more recesses, the at least one sidewall comprising one or more snap fit protrusions situated within the one or more recesses.

10. The fan receiver assembly of claim 9, the at least one deformable clasp deformer/retainer comprising at least one arm deformer causing the at least one latching arm the at least one deformable clasp to pivot from the axially displaced open position to the parallel position when the wings translate within the translation slot toward the rear wall.

11. The fan receiver assembly of claim 10, further comprising one or more bosses extending distally from the rear wall from a base at the rear wall a distal end defining an inward taper.

12. A method of assembling a fan receiver assembly, the method comprising:
providing a fan receiver comprising a first sidewall, a second sidewall, and a rear wall interspacing the first sidewall and the second sidewall, each of the first sidewall and the second sidewall comprising:
a raised platform and a d-track recessed into the raised platform; and
a pair of L-shaped rails defining a translation slot;
placing one or more coiled springs into a cavity defined by the rear wall, the first sidewall, and the second sidewall;
placing a first follower and a first flat spring a blind slot of a first deformable clasp and a second follower and second flat spring another blind slot of a second deformable clasp; and
coupling the first deformable clasp and the second deformable clasp to the fan receiver by inserting wings of the first deformable clasp into the translation slot of the first sidewall and wings of the second deformable clasp in the translation slot of the second sidewall, thereby causing the first follower to be biased in the d-track of the raised platform of the first sidewall and the second follower to be biased in the d-track of the raised platform of the second sidewall.

13. The method of claim 12, further comprising coupling a first deformable clasp deformer/retainer to the first sidewall and a second deformable clasp deformer/retainer to the second sidewall by passing recesses defined in the rear sides of the first deformable clasp deformer/retainer and the second deformable clasp deformer/retainer over snap fit protrusions disposed along interiors of the first sidewall and the second sidewall.

14. The method of claim 13, further comprising coupling one or more spring-biased electrical connectors to the rear wall.

15. A fan receiver assembly, comprising:
a rear wall, a first sidewall extending distally from a first end the rear wall, and a second sidewall extending distally from a second, opposite end of the rear wall;
a first deformable clasp coupled to, and translatable along, the first sidewall;
a second deformable clasp coupled to, and translatable along, the second sidewall;
one or more coiled springs biasing the first deformable clasp away from the rear wall;
one or more other coiled springs biasing the second deformable clasp away from the rear wall;
one or more spring-biased electrical connectors coupled to the rear wall; and
a fan module, latched to the fan receiver assembly, and comprising one or more complementary electrical connectors;
the first deformable clasp and the second deformable clasp each comprising one or more latching arms pivotable between an axially displaced open position when the one or more latching arms extend beyond terminal ends of the first sidewall and the second sidewall and a parallel position when the one or more latching arms are situated between the first side wall and the second sidewall.

16. The fan receiver assembly of claim 15, each of the first sidewall and the second sidewall comprising a d-track comprising a terminal end and an outward notch, further comprising a first follower biased from the first deformable latch into the d-track of the first sidewall and a second follower biased from the second deformable latch into the d-track of the second sidewall.

17. The fan receiver assembly of claim 16, the one or more latching arms each comprising at least one latch and at least one L-shaped foot latching the fan module to the fan receiver assembly when the first follower and the second follower situate within the outward notch of the d-track of the first sidewall and the second sidewall, respectively, with the one or more complementary electrical connectors electrically coupled to the one or more spring-biased electrical connectors.

\* \* \* \* \*